United States Patent
Watanabe

(10) Patent No.: US 9,647,612 B2
(45) Date of Patent: May 9, 2017

(54) POWER AMPLIFYING APPARATUS AND POWER AMPLIFYING METHOD

(71) Applicant: JVC KENWOOD Corporation, Yokohama (JP)

(72) Inventor: Kenji Watanabe, Yokohama (JP)

(73) Assignee: JVC KENWOOD Corporation, Yokohama-shi (JP)

( * ) Notice: Subject to any disclaimer, the term of this patent is extended or adjusted under 35 U.S.C. 154(b) by 0 days.

(21) Appl. No.: 14/806,409

(22) Filed: Jul. 22, 2015

(65) Prior Publication Data
US 2016/0094188 A1   Mar. 31, 2016

(30) Foreign Application Priority Data

Sep. 30, 2014  (JP) .................. 2014-202043
Sep. 30, 2014  (JP) .................. 2014-202044

(51) Int. Cl.
| | |
|---|---|
| H03F 1/34 | (2006.01) |
| H03F 1/30 | (2006.01) |
| H03F 3/183 | (2006.01) |
| H03F 3/217 | (2006.01) |

(52) U.S. Cl.
CPC ............ *H03F 1/30* (2013.01); *H03F 1/34* (2013.01); *H03F 3/183* (2013.01); *H03F 3/2178* (2013.01); *H03F 2200/03* (2013.01); *H03F 2200/321* (2013.01); *H03F 2200/351* (2013.01); *H03F 2200/462* (2013.01)

(58) Field of Classification Search
CPC ........ H03F 1/34; H03F 2200/129; H03F 3/38; H03F 2200/117
USPC ........................................ 330/10, 102, 103
See application file for complete search history.

(56) References Cited

U.S. PATENT DOCUMENTS

| | | | | |
|---|---|---|---|---|
| 4,628,275 A | * | 12/1986 | Skipper ............... | H03F 3/2171 330/10 |
| 7,525,376 B2 | * | 4/2009 | Boughton, Jr. ........ | H03F 1/56 330/102 |
| 8,729,964 B2 | * | 5/2014 | Rice ....................... | H03F 3/16 330/102 |

FOREIGN PATENT DOCUMENTS

| | | |
|---|---|---|
| JP | 7-131272 A | 5/1995 |
| JP | 3922182 B2 | 3/2007 |
| JP | 2011-171967 A | 9/2011 |
| JP | 2013-521699 A | 6/2013 |
| WO | WO-2011/109152 A1 | 9/2011 |

* cited by examiner

*Primary Examiner* — Steven J Mottola
(74) *Attorney, Agent, or Firm* — Venable LLP; Michael A. Sartori; Laura G. Remus

(57) ABSTRACT

A power amplifying apparatus includes an amplifier configured to amplify an input signal and supply a load with the amplified input signal, a current detecting circuit, disposed at an output stage of the amplifier, configured to detect a current of an output signal from the amplifier, a current feedback circuit configured to provide feedback of the detected current of a certain feedback amount, a voltage feedback circuit configured to provide feedback of a voltage of the output signal of a certain feedback amount, and an adjuster configured to adjust the input signal using the feedback current and the feedback voltage.

15 Claims, 20 Drawing Sheets

| ITEM | REQUIRED OR SETTING VALUE (REPRESENTATIVE VALUE) |
|---|---|
| AMPLIFIER GAIN | 27 dB |
| MAXIMUM OUTPUT POWER | 90 W/4 Ω |
| AMPLIFIER INTERNAL GAIN A | 70 dB |
| SENSE RESISTANCE Rs | 50 mΩ |
| INTERNAL RESISTANCE Ro | 50 mΩ |
| LOOP GAIN | 20 dB MINIMUM |
| AMPLIFIER OUTPUT VOLTAGE VARIATION | ±10% MAXIMUM |
| PERMISSIBLE CIRCULATING CURRENT | ±2.5 A MAXIMUM |
| GAIN VARIATION RANGE (LOAD DEPENDENCY) | 3 dB MAXIMUM |

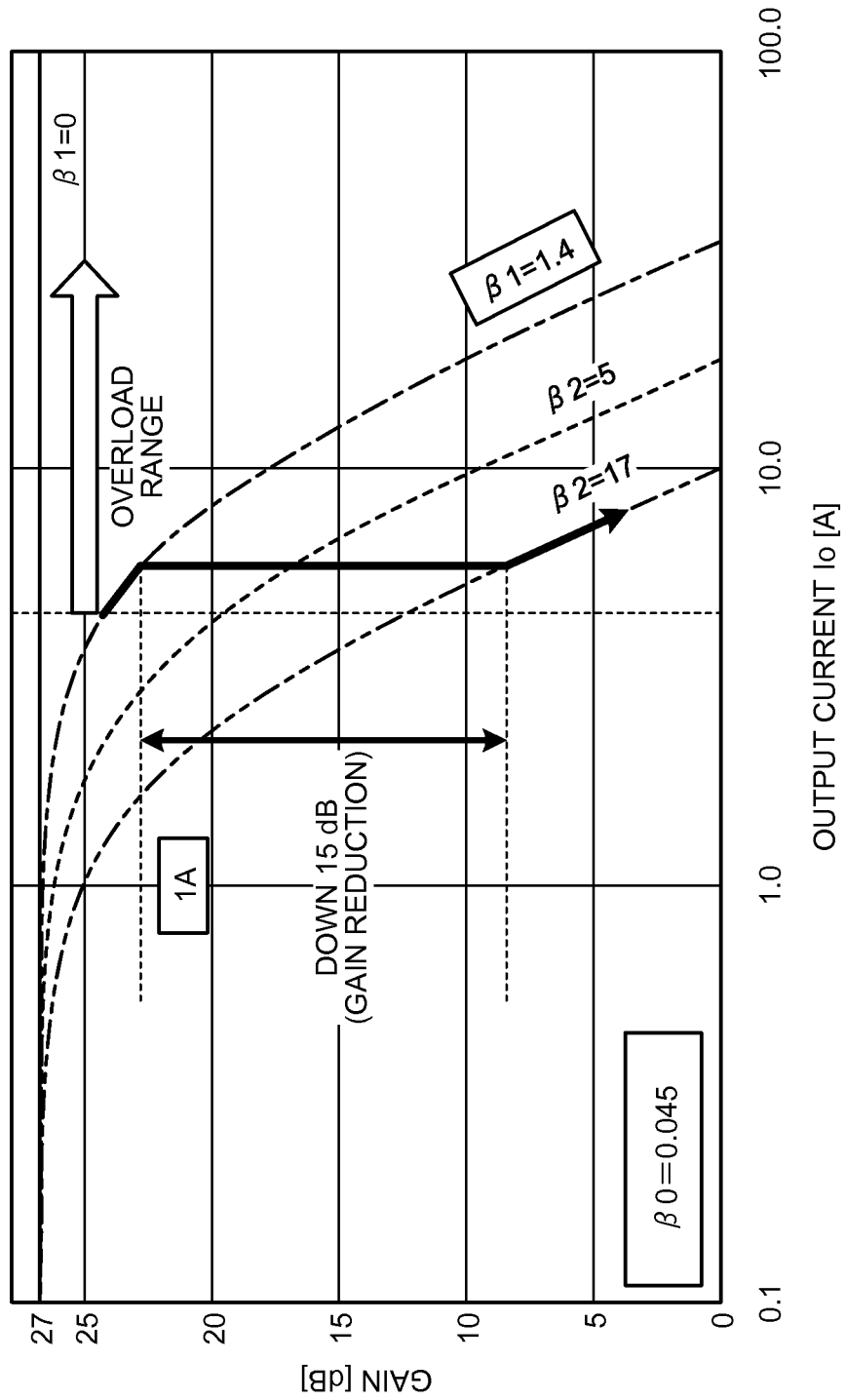

POWER AMPLIFYING APPARATUS AND POWER AMPLIFYING METHOD

CROSS-REFERENCE TO RELATED APPLICATIONS

The present application claims priority to and incorporates by reference the entire contents of Japanese Patent Application No. 2014-202043 filed in Japan on Sep. 30, 2014 and Japanese Patent Application No. 2014-202044 filed in Japan on Sep. 30, 2014.

BACKGROUND OF THE INVENTION

1. Field of the Invention

The present invention relates to a power amplifying apparatus and a power amplifying method.

2. Description of the Related Art

Today, digital amplifiers (class D amplifiers) are known that perform power amplification with switching circuits by using pulse width modulation (PWM) or pulse density modulation (PDM). The digital amplifiers can achieve amplification at high efficiencies of, for example, a maximum of 90% or higher, and produce less heat, and therefore be applied to, for example, mini-audio components, car audio systems, and portable music players.

To operate a plurality of digital amplifiers in parallel with each other, consideration needs to be given to variations in amplifier gain and in power source voltage, and other factors. Thus, a known system operates a plurality of digital amplifiers in parallel by combining a non-feedback digital amplifier with a non-feedback power supply to fluctuate the power source voltage (a first system).

Japanese Patent Application Laid-open No. 2013-521699 discloses a system for operating a plurality of digital amplifiers in parallel by limiting a current through local current feedback provided before a digital amplifier demodulator (LC filter) (a second system).

Additionally, Japanese Laid-open Patent Publication No. 07-131272 discloses a system for operating a plurality of digital amplifiers in parallel by providing feedback of a state through an advance input of an output load value (a third system).

Meanwhile, variations in load resistance of a load, such as a speaker unit, connected to the digital amplifier may cause a current flowing from the digital amplifier to the load to vary, thus affecting, for example, audio characteristics.

The following first through third techniques are known as arts for making the current flowing from the digital amplifier to the load constant even with fluctuating load resistance. A field effect transistor (FET) is inserted and connected in series with an output line of the digital amplifier. When a line load of the speaker unit short-circuits (e.g., about 1 to 3Ω), the FET controls to keep the output current constant (a fourth system).

Japanese Patent Application Laid-open No. 2011-171967 discloses a technique in which, when a predetermined current or more is detected to flow through a demodulator circuit (in an LC filter), the output switch of the digital amplifier is turned off and the current flowing through the load is thereby cut off (a fifth system).

Japanese Patent No. 3922182 discloses a technique in which, when a predetermined amount or more of a load current flowing through a load, such as a speaker unit, is detected, a sound signal to be input is limited to prevent the signal output from exceeding a predetermined level (a sixth system).

With the first system, however, to prevent a faulty current between the amplifiers due to, for example, variations in the amplifier gain during a parallel operation, the power source voltage needs to be fluctuated until it builds up. This requires greater voltage resistance on the part of circuit elements, which results in increased component dimensions and an increased cost. Additionally, due to restrictions on the power source voltage involved in the first system, the number of digital amplifiers to be connected in parallel is unfortunately limited.

In the second system disclosed in Japanese Patent Application Laid-open No. 2013-521699, the digital amplifiers are generally a voltage feedback type because of the local current feedback and the voltage feedback after the demodulation. The second system thus involves difficulty of adjusting a current feedback ratio with respect to load variations. Additionally, the second system does not directly measure the load currents, so that it offers low current accuracy. The number of digital amplifiers to be connected in parallel is also limited in the second system.

The third system disclosed in Japanese Laid-open Patent Publication No. 07-131272 requires the load to be measured in advance to calculate parameters. Complicated control is thus required, resulting in an increased cost. The third system has difficulty in responding to load variations. An example of the load variations includes the following. Specifically, consider a setting in which a speaker unit on the first floor of a house and a speaker unit on the second floor of the house are set as loads. To obtain a sound output only from the speaker unit on the first floor, an operation is first performed to select only the speaker unit on the first floor as a sound output port. This operation results in the loads corresponding to the speaker unit on the first floor and the speaker unit on the second floor to be varied to only the load of the speaker unit on the first floor.

These systems in the known arts make favorable operations difficult when a plurality of digital amplifiers is connected in parallel with each other.

With the fourth system, the output current is controlled to stay at a constant value by the FET inserted and connected in series with the output line of the digital amplifier. An increased load is thus placed on the FET, resulting in a reduced service life of the FET element. The fourth system further requires a FET capable of handling large currents, so that a resultant increase in a mounting area leads to an increased cost.

The fifth system disclosed in Japanese Patent Application Laid-open No. 2011-171967 detects a current in the demodulator circuit (in the LC filter), which makes it difficult to measure current with high accuracy. Additionally, controlling to turn off the output switch of the digital amplifier when a predetermined amount or more of current flows, degrades sound quality, which makes it difficult to listen to the sound.

In the sixth system disclosed in Japanese Patent No. 3922182, the sound signal to be input is limited when a predetermined amount or more of the current is detected. This arrangement distorts the sound during operation, which makes it difficult to listen to the sound.

SUMMARY OF THE INVENTION

It is an object of the present invention to at least partially solve the problems in the conventional technology.

There is provided a power amplifying apparatus that includes an amplifier configured to amplify an input signal and supply a load with the amplified input signal, a current detecting circuit, disposed at an output stage of the amplifier, configured to detect a current of an output signal from the amplifier, a current feedback circuit configured to provide feedback of the detected current of a certain feedback amount, a voltage feedback circuit configured to provide feedback of a voltage of the output signal of a certain feedback amount, and an adjuster configured to adjust the input signal using the feedback current and the feedback voltage.

There is also provided a power amplifying method that includes amplifying an input signal and supplying a load with the amplified input signal by an amplifier, detecting a current of an output signal from the amplifier by a current detecting circuit disposed at an output stage of the amplifier, providing feedback of the detected current of a certain feedback amount by a current detecting circuit, providing feedback of a voltage of the output signal of a certain feedback amount by a voltage feedback circuit, and adjusting the input signal using the feedback current and the feedback voltage by an adjuster.

The above and other objects, features, advantages and technical and industrial significance of this invention will be better understood by reading the following detailed description of presently preferred embodiments of the invention, when considered in connection with the accompanying drawings.

BRIEF DESCRIPTION OF THE DRAWINGS

FIG. 22 is a graph for illustrating dependency of the gain on the output current at a timing after the changeover of the current feedback amount in the power amplifying apparatus according to the sixth embodiment to which the present invention is applied.

DETAILED DESCRIPTION OF THE PREFERRED EMBODIMENTS

The following describes in detail with reference to the accompanying drawings power amplifying apparatuses according to preferred embodiments to which the present invention is applied.

Overview

The power amplifying apparatuses according to the preferred embodiments each combine current feedback and voltage feedback of a demodulated sound signal. The power amplifying apparatus according to the preferred embodiment can easily set a current feedback amount and a voltage feedback amount of the demodulated signal to absorb variations between amplifiers with high accuracy. The power amplifying apparatus does not need to be made resistant to higher voltages and can thus be achieved through a simple circuit configuration. The power amplifying apparatus can automatically respond to load variations, thereby enabling favorable parallel operations.

Additionally, when the output current increases to reach a threshold value as a result of reduced load resistance, the power amplifying apparatus according to the preferred embodiment changes the current feedback amount to reduce the load current. The power amplifying apparatus according to the preferred embodiment thereby reduces, for example, sound distortion. Not requiring a power FET inserted in series with the amplifier output, the power amplifying apparatus according to the preferred embodiment can prevent unnecessary heat generation. In addition, the power amplifying apparatus according to the preferred embodiment varies the current feedback amount through calculations from a short-circuit current so as to respond to both a line short circuit load and an incomplete load short circuit. The power amplifying apparatus can reduce distortion of the sound signal even during control of the output current so as to be able to transmit a sound clearly to a speaker unit. Additionally, being able to freely set the current feedback amount, the power amplifying apparatus can be favorably adapted to a product of any category, any use environment, and any use site.

First Embodiment

Figure 1:
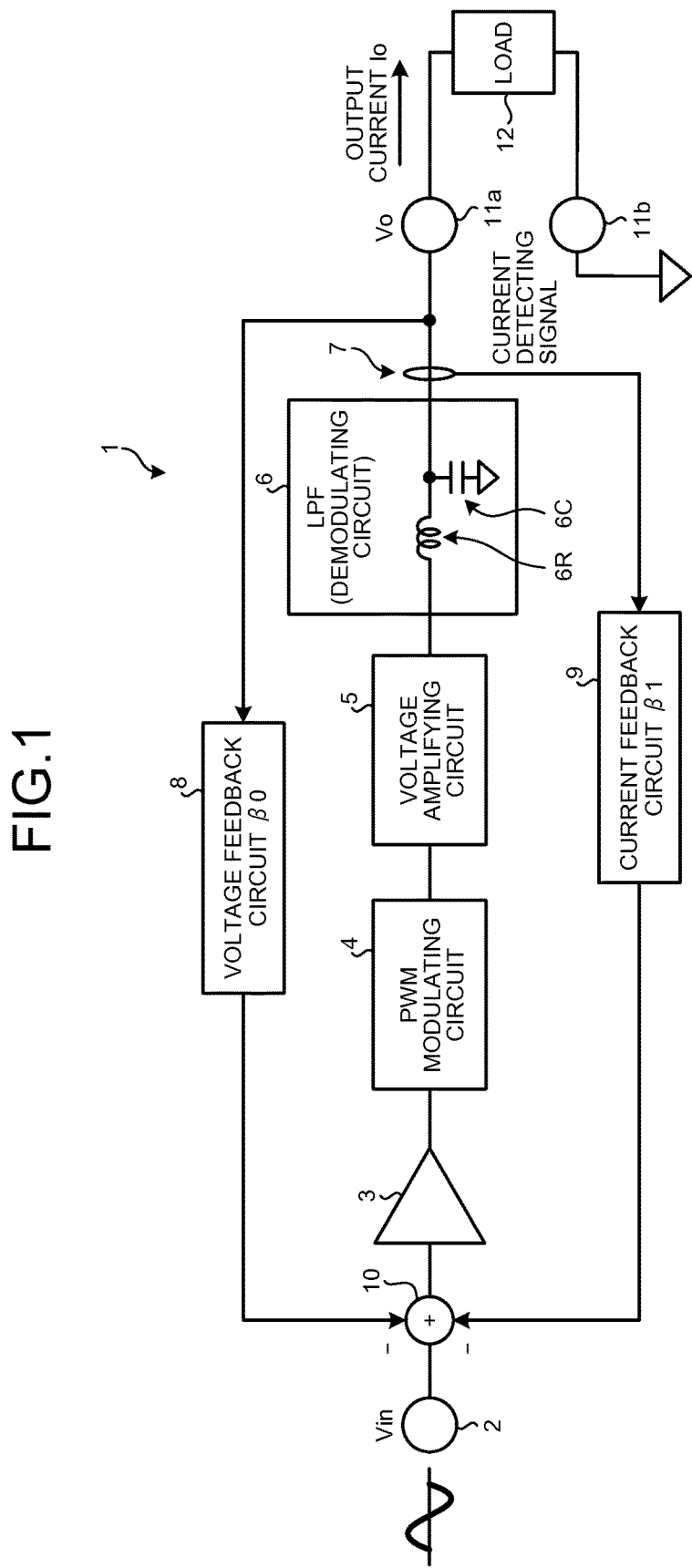
FIG. 1 is a block diagram illustrating a power amplifying apparatus according to a first embodiment to which the present invention is applied.

FIG. 1 is a block diagram illustrating a power amplifying apparatus 1 according to a first embodiment of the present invention. The power amplifying apparatus 1 illustrated in FIG. 1 is an exemplary single-end type. The power amplifying apparatus 1 includes an input terminal 2, op-amp circuit 3, a PWM modulating circuit 4, a voltage amplifying circuit 5, a low-pass filter (LPF: demodulating circuit) 6, a current detecting circuit 7, a voltage feedback circuit 8, a current feedback circuit 9, an adder 10, and output terminals 11a and 11b. The power amplifying apparatus 1 is connected to a load 12 such as a speaker unit. The voltage amplifying circuit 5 is an exemplary amplifier. The adder 10 is an exemplary adjuster.

A sound signal (Vin) is supplied to the input terminal 2. The op-amp circuit 3 amplifies the input sound signal by predetermined gain and outputs the resultant amplified signal. The PWM modulating circuit 4 subjects the amplified sound signal to pulse width modulation. PWM is an abbreviation for "pulse width modulation". A delta-sigma modulator ($\Delta\Sigma$ modulator) may be used instead of the PWM modulating circuit 4.

The voltage amplifying circuit 5 amplifies a voltage of the pulse width-modulated sound signal by a predetermined amount. Specifically, two output power MOSFETs may, for example, be incorporated to switch a relatively high voltage at a timing of a pulse width of the pulse width-modulated sound signal. MOSFET is an abbreviation for "metal-oxide-semiconductor field-effect transistor". This process obtains a pulse width-modulated sound signal with a large voltage amplitude. The LPF 6 includes a coil 6R inserted and connected in series with a sound signal line and a capacitor 6C connected in parallel between an output side of the coil 6R and ground. The LPF 6 removes a high frequency component from the pulse width-modulated sound signal and supplies a resultant signal to the load 12 via the output terminals 11a and 11b.

The voltage feedback circuit 8 provides negative feedback of a voltage value ($\beta 0$) of the sound signal having the high frequency component removed by the LPF 6. The current feedback circuit 9 provides negative feedback of a voltage value ($\beta 1$) corresponding to a current value, detected by the current detecting circuit 7, of the sound signal having the high frequency component removed by the LPF 6. The adder 10 adds each of the negative feedback voltage values ($\beta 0$ and $\beta 1$) to the input sound signal. When a plurality of the power amplifying apparatuses 1 are connected in parallel, the foregoing allows, for example, variations in amplifier gain and in power supply voltage to be absorbed to enable favorable parallel operations.

Figure 2:
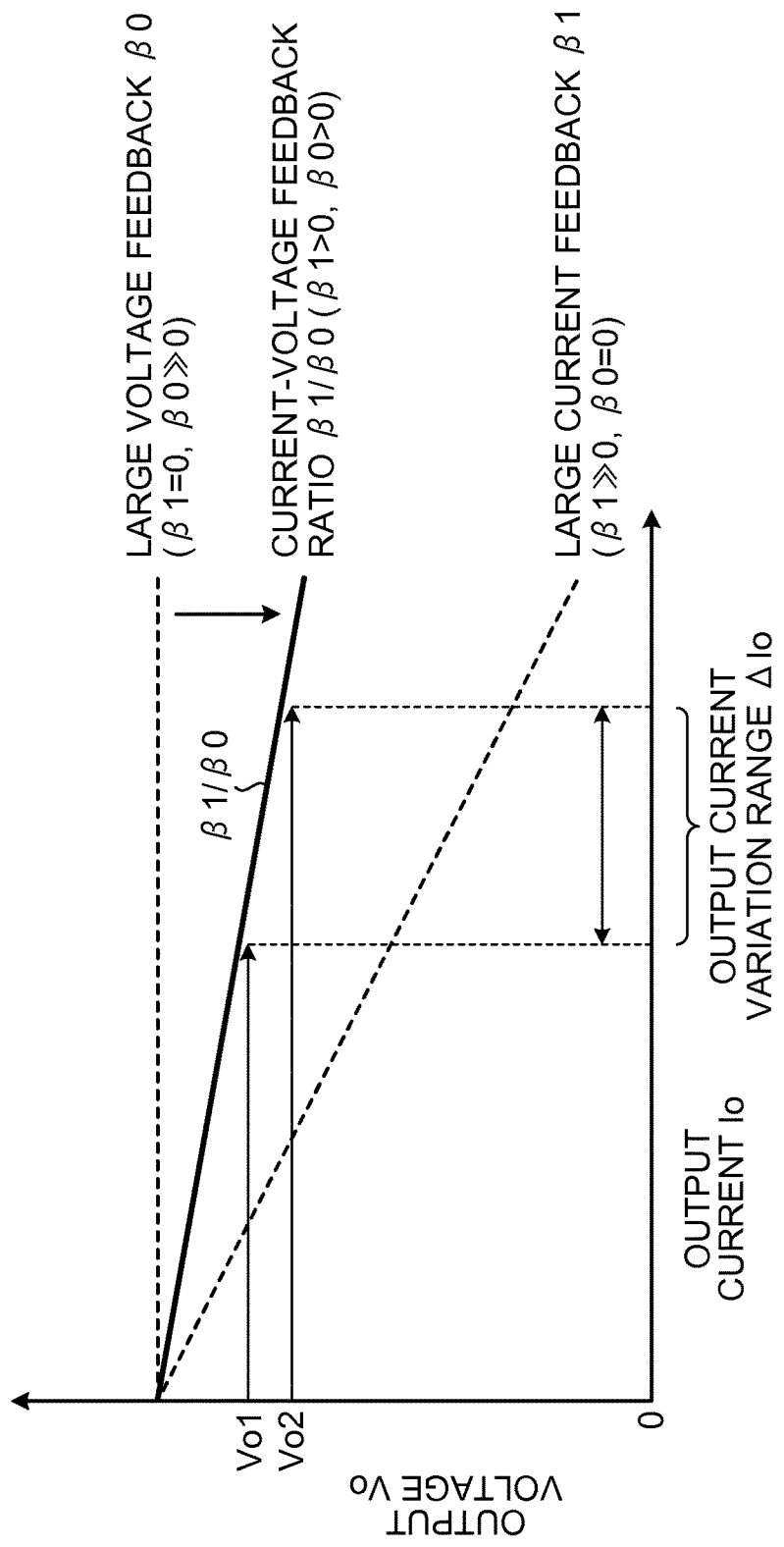
FIG. 2 is a graph for illustrating theory of operation of the power amplifying apparatus according to the first embodiment.

The following describes a theory that causes a power amplifying apparatus 1 in the first embodiment to enable favorable parallel operations. FIG. 2 illustrates, in a configuration of two power amplifying apparatuses 1 connected in parallel with each other, a relation between an output current Io after the LPF 6 (the abscissa) and an output voltage (Vo) after the LPF 6. In FIG. 2, a large voltage feedback amount $\beta 0$ ($\beta 1=0$, $\beta 0\gg 0$) impedes parallel operations of the power amplifying apparatuses 1, though achieving favorable audio performance. Audio performance is favorable when variations in the sound signal voltage is small. In contrast, a large current feedback amount $\beta 1$ ($\beta 1\gg 0$, $\beta 1=0$) impedes audio performance, though achieving favorable parallel operations of the power amplifying apparatuses 1.

In FIG. 2, Vo1 denotes the output voltage of one of the two power amplifying apparatuses 1 connected in parallel with each other and Vo1 denotes the output voltage of the other of the two power amplifying apparatuses 1 connected in parallel with each other. Even with variations in the output voltages as with Vo1 and Vo1 (Vo1>Vo2) occurring between the two power amplifying apparatuses 1 connected in parallel with each other, an output current variation range $\Delta$Io is smaller at greater gradients corresponding to an output voltage difference between Vo1 and Vo2, enabling favorable parallel operations of the power amplifying apparatuses 1. Adjusting a current-voltage feedback ratio $\beta 1/\beta 0$ enables favorable parallel operations of the power amplifying apparatuses 1, while ensuring audio performance. Too great a gradient of the current-voltage feedback ratio $\beta 1/\beta 0$, however, considerably degrades the audio performance (gain variation, distortion factor, rated output, and PSRR) and is not good for practical use. PSRR is an abbreviation for "power supply rejection ratio".

Thus, when the variation in the output voltage Vo1 and the output voltage Vo2 in each of the power amplifying apparatuses 1 connected in parallel with each other is large, the power amplifying apparatus 1 in the first embodiment increases the current-voltage feedback ratio $\beta 1/\beta 0$ to increase the gradient of the output voltage Vo with respect to the output current Io. The power amplifying apparatus 1 in the first embodiment thereby enables favorable parallel operations with widely varying variations.

Additionally, the power amplifying apparatus 1 in the first embodiment provides feedback from a stage in rear of the LPF 6 that operates as a demodulating circuit. Thus, the values of the current feedback amount $\beta 1$ and the voltage feedback amount $\beta 0$ can be independently and readily adjusted.

Figure 3:
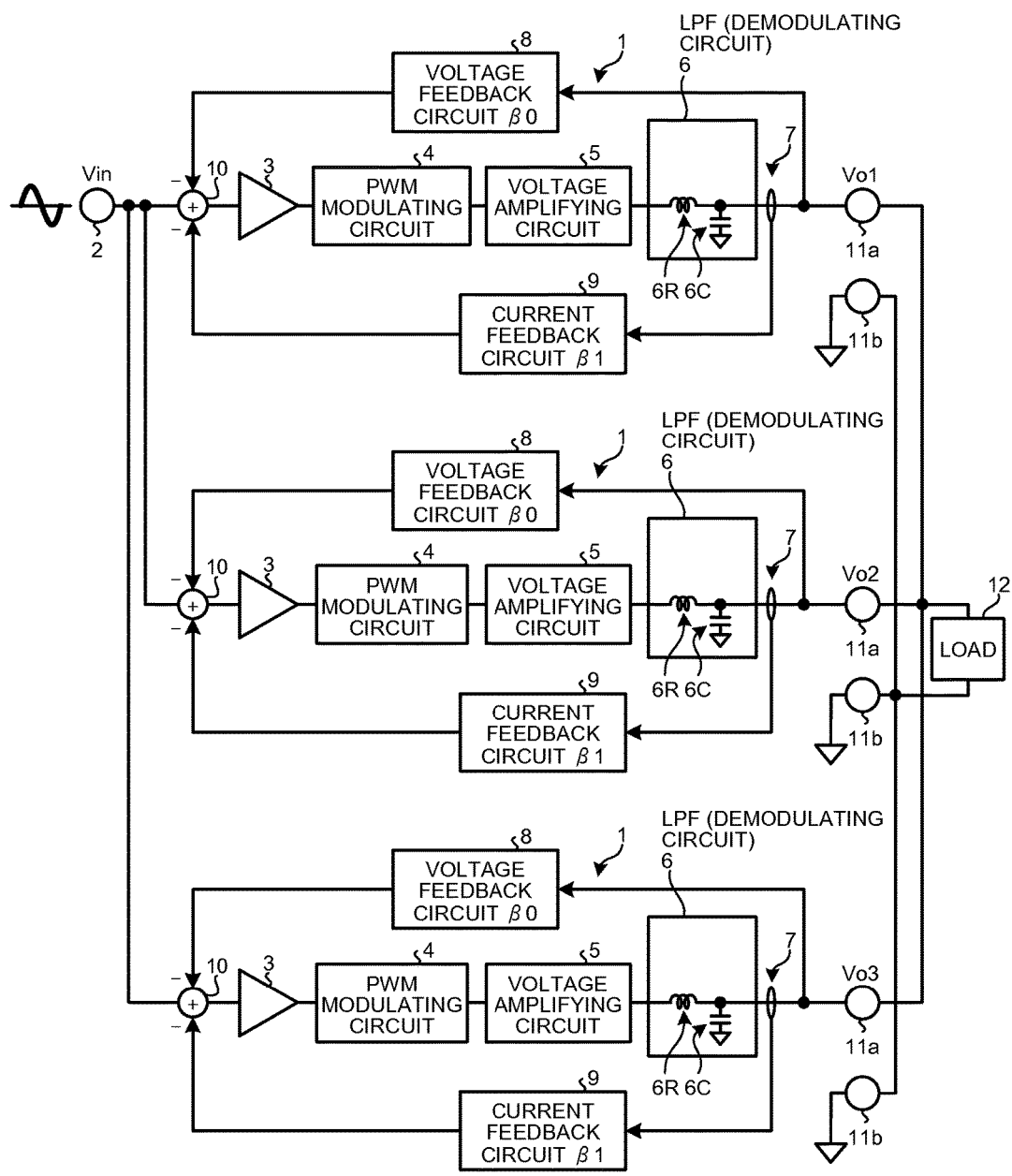
FIG. 3 is a block diagram illustrating a condition in which the power amplifying apparatuses according to the first embodiment are connected in parallel with each other.

It is noted that FIG. 2 represents an example of two power amplifying apparatuses 1 connected in parallel with each other. FIG. 3 is an exemplary configuration comprising three power amplifying apparatuses 1 connected in parallel with each other. In the example illustrated in FIG. 3, the three power amplifying apparatuses 1 are connected in parallel with each other such that the sound signal input from the input terminal 2 is supplied to each op-amp circuit 3 via the adder 10 in each of the three power amplifying apparatuses 1 and that the output terminals 11a and 11b in each of the three power amplifying apparatuses 1 are connected to the load 12. In this case, too, given the range of variations in the output voltage of each power amplifying apparatus 1, the adjustment of the gradient of the output voltage Vo with respect to the output current Io enables a favorable parallel connection of the three power amplifying apparatuses 1. The same holds for the parallel connection of four or more power amplifying apparatuses 1.

Figure 4:
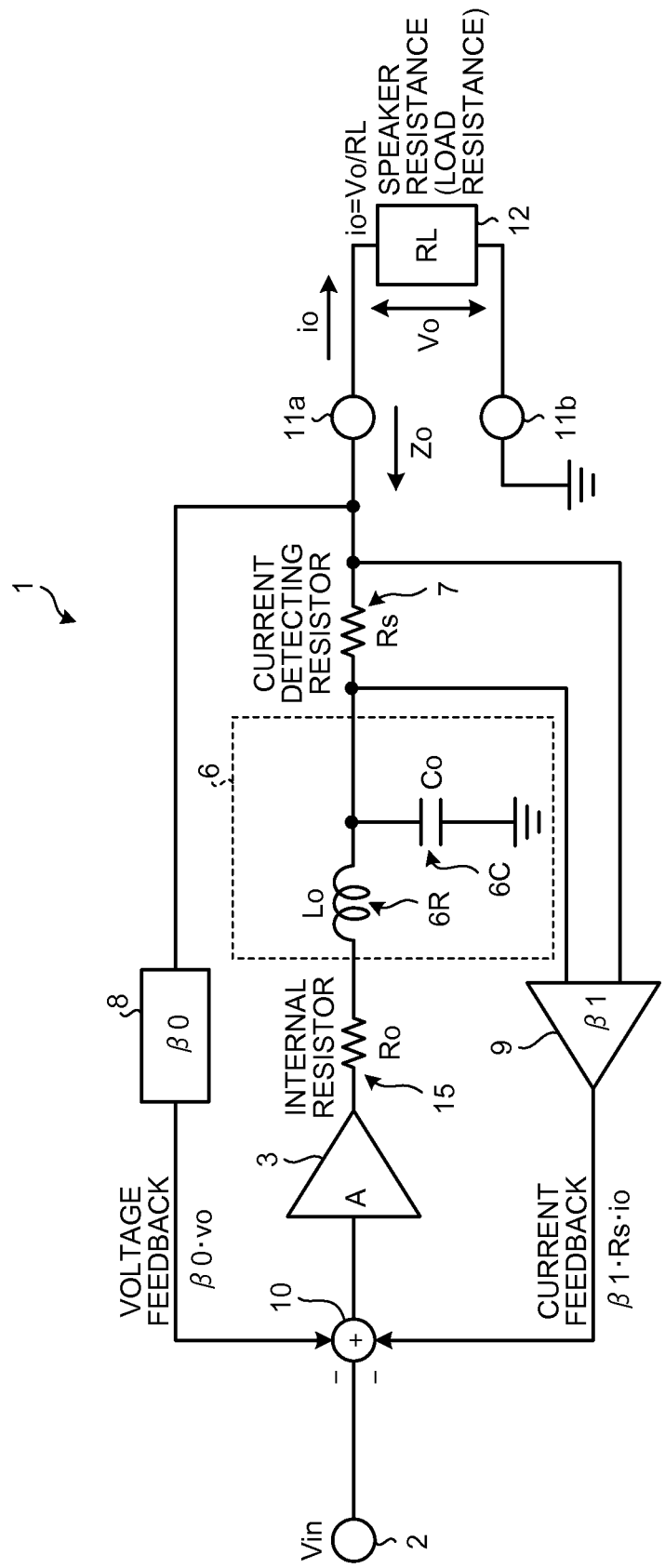
FIG. 4 is an equivalent circuit diagram of the power amplifying apparatus according to the first embodiment.

The following describes how to derive amplifier gain, loop gain, and output resistance of the power amplifying apparatus 1. FIG. 4 is an equivalent circuit diagram of the power amplifying apparatus 1 illustrated in FIG. 1. In FIG.

4, an internal resistor Ro is, for example, a MOSFET ON resistor of the voltage amplifying circuit 5 and a direct current resistor of the coil 6R (Lo) of the LPF 6. The current detecting circuit 7 is replaced by a sense resistor Rs (a current detecting resistor Rs). The current detecting circuit 7 detects a potential difference (voltage) across the current detecting resistor Rs as a current value io of the sound signal demodulated by the LPF 6. It is noted that the current value io of the sound signal=a resistance value RL of an output voltage Vo/load 12.

The current feedback circuit 9 provides the adder 10 with negative feedback of a voltage value of "adjusted current feedback amount β1×current detecting resistance Rs×current value io of the sound signal". Although the current value io of the sound signal demodulated by LPF 6 is detected with the current detecting resistor Rs in the example described above, a transformer may be inserted in place of the current detecting resistor Rs and a secondary voltage thereof is detected as the current value io of the sound signal. The voltage feedback circuit 8 provides the adder 10 with negative feedback of a voltage value of "voltage value Vo of the sound signal output from the LPF 6×adjusted voltage feedback amount β0". Reference numeral Zo in FIG. 4 denotes an output impedance of the power amplifying apparatus 1 (output resistance of the power amplifying apparatus 1).

In the equivalent circuit of the power amplifying apparatus 1 as described above, the amplifier gain (Gain) of the power amplifying apparatus 1 is calculated using expression 1 given below, the loop gain (Loop Gain) of the power amplifying apparatus 1 is calculated using expression 2 given below, and the output resistance Zo of the power amplifying apparatus 1 is calculated using expression 3 given below. In each of the expressions 1, 2, and 3, reference numeral "A" denotes internal gain of the power amplifying apparatus 1, including gain of the op-amp circuit 3 and the voltage amplifying circuit 5. Additionally, the following holds: "A×β0≫1" and "A×β1≫1".

$$\text{Gain} = \partial Vo/\partial Vin \approx A/(1+A\times(\beta 0+\beta 1\times(Rs/Zo))) \approx 1/(\beta 0+\beta 1\times(Rs/Zo)) \quad \text{Expression 1}$$

$$\text{Loop Gain} \approx A\times(\beta 0+\beta 1\times(Rs/Zo)) \quad \text{Expression 2}$$

$$Zo = \partial Vo/\partial io \approx (((1+A\times\beta 1)/(1+A\times\beta 0))\times Rs) + ((1/(1+A\times\beta 0))\times Ro) \approx (\beta 1/\beta 0)\times Rs \quad \text{Expression 3}$$

The amplifier gain (Gain), the loop gain (Loop Gain), and the output resistance Zo of the power amplifying apparatus 1 each hold through a combination of the voltage feedback amount β0 and the current feedback amount β1.

Figures 5, 6:
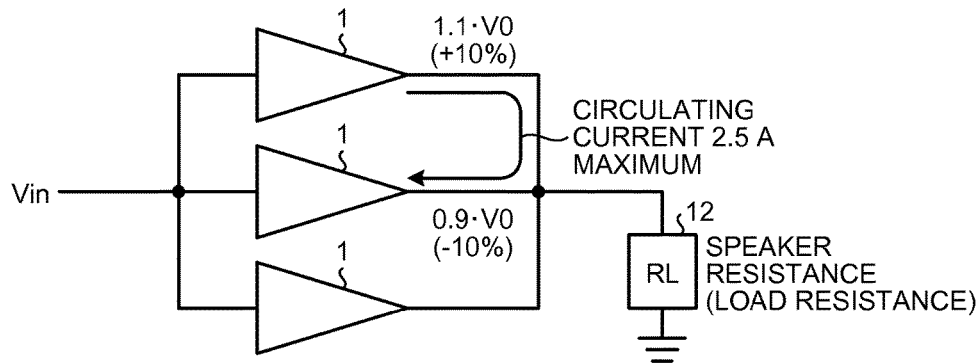
FIG. 5 is a diagram illustrating exemplary design requirements for the power amplifying apparatuses connected in parallel with each other according to the first embodiment.
FIG. 6 is a table listing required or setting values corresponding to different design items for the power amplifying apparatuses connected in parallel with each other according to the first embodiment.

The following describes design requirements for the power amplifying apparatus 1. FIG. 5 schematically illustrates three power amplifying apparatuses 1 connected in parallel with each other and connected to the load 12 such as a speaker unit. The power amplifying apparatus 1 needs to be designed so as to satisfy first through seventh requirements described below in order to allow the power amplifying apparatuses 1 connected in parallel with each other to exhibit favorable parallel operations and to achieve favorable audio performance.

First Requirement

The amplifier gain (Gain) is uniformly established at the time of system design and is exemplarily 27 dB.

Second Requirement

The output power of the power amplifying apparatus 1 is also uniformly established at the time of system design and is exemplarily 90 W/4Ω maximum.

Third Requirement

As an amplifier operation, Loop Gain≥20 dB for the improved sound quality (improved audio performance).

Fourth Requirement

A variation in the output voltage of each of the power amplifying apparatuses 1 performing parallel operations is ±10% or less as indicated in FIG. 5.

Fifth Requirement

A circulating current that flows with the maximum voltage variation (±10%) in each of the power amplifying apparatuses 1 performing parallel operations is 2.5 A or less as indicated in FIG. 5.

Sixth Requirement

The output resistance Zo of the power amplifying apparatus 1 for achieving the circulating current of 2.5 A is derived.

Seventh Requirement

A gain variation range of the power amplifying apparatus 1 when the load 12 is reduced (when a large current is output) is within 3 dB.

The voltage feedback amount β0 and the current feedback amount β1 that satisfy the abovementioned first through seventh requirements exist in a limited range. If a point at which the first through seventh requirements are satisfied can be found, the voltage feedback amount β0 and the current feedback amount β1 emphasize each other and are combined to enable favorable parallel operations and achieve favorable audio performance.

The power amplifying apparatus 1 in the first embodiment enables favorable parallel operations and achieves favorable audio performance by using the voltage feedback amount β0 and the current feedback amount β1 derived as described below. FIG. 6 is a table that summarizes required or setting values (representative values) corresponding to different engineering items. As touched upon earlier and indicated in FIG. 6, the amplifier gain of the power amplifying apparatus 1 is set to 27 dB; the output power of the power amplifying apparatus 1 is set to a maximum of 90 W/4Ω; the internal gain A of the power amplifying apparatus 1 is set to 70 dB; the resistance value of the current detecting resistor Rs is set to 50 mΩ; the loop gain is set to 20 dB minimum; the variation in the output voltage of the power amplifying apparatus 1 is ±10% maximum; the permissible circulating current is ±2.5 A maximum; and the variation range (load dependency) of the amplifier gain of the power amplifying apparatus 1 is 3 dB maximum.

Under these conditions and given that the amplifier gain of the power amplifying apparatus 1 from FIG. 6 is 27 dB, the expression 1 is used to calculate the voltage feedback amount β0=0.045. Specifically, with only the voltage feedback (β1=0), converting the expression 1 obtains β0=1/gain. Because the amplifier gain is 27 dB (22.4 times) from FIG. 6, the voltage feedback amount β0 can be calculated as 1/22.4=0.045.

From the conditions of the maximum output power of 90 W/4Ω, the variation in the output voltage of each power amplifying apparatus 1 of ±10% maximum, and the permissible circulating current of ±2.5 A maximum and using the expression 3, the output resistance Zo of the power amplifying apparatus 1 is calculated. An expression for finding the output resistance Zo corresponding to the foregoing conditions is expression 4 given below.

$$Zo = (\sqrt{90}\ W \times \sqrt{4\Omega} \times (1.1-0.9))/2.5\ A \approx 1.5\ \Omega \quad \text{Expression 4}$$

Figure 7:
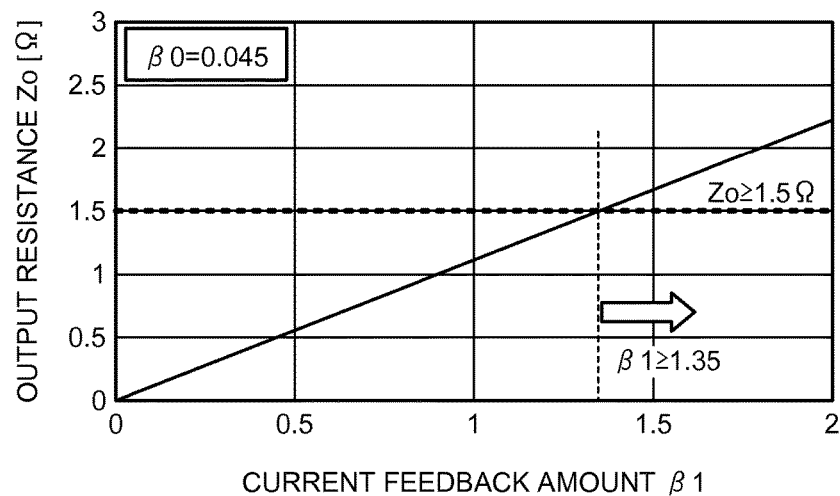
FIG. 7 is a graph illustrating dependency of output resistance on a current feedback amount in the power amplifying apparatuses connected in parallel with each other according to the first embodiment.

The expression 4 tells that the output resistance Zo is required to be equal to or greater than 1.5Ω. FIG. 7 illustrates a relation (dependency) between the output resistance Zo and the current feedback amount β1 when the voltage feedback amount β0 is 0.045. As is known from FIG. 7, the current feedback amount β1 when the output resistance Zo 1.5Ω is equal to or greater than 1.35.

Figure 8:
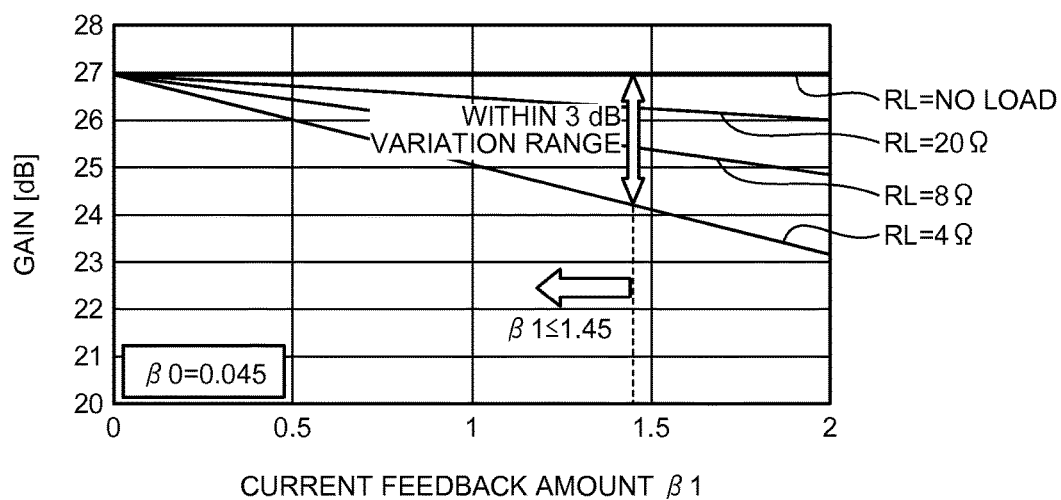
FIG. 8 is a graph illustrating dependency of gain on the current feedback amount in the power amplifying apparatuses connected in parallel with each other according to the first embodiment.

As illustrated in FIG. 6, the gain variation range caused by load variations (no load, 4 Ω, 8Ω, and 20Ω) in the load 12 needs to be kept to 3 dB or below. FIG. 8 illustrates a relation (dependency) between the amplifier gain of the power amplifying apparatus 1 and the current feedback amount β1 when the voltage feedback amount β0 is 0.045. As is known from the abovementioned expression 1 and FIG. 7, the current feedback amount β1 that results in a load variation within 3 dB is equal to or less than 1.45.

FIGS. 7 and 8 indicate that the current feedback amount β1 has an optimum value ranging as follows: "1.35≤β1≤1.45". Thus, the voltage feedback amount β0 has a design value set as β0=0.045 and the current feedback amount β1 has a design value set as β1=1.40 (a median value between 1.35 and 1.45). A value of 46 dB as a loop gain value can be found by substituting the design value of the voltage feedback amount β0 and the design value of the current feedback amount β1 for the expression 2 mentioned above. As indicated in FIG. 6, the loop gain requirement is 20 dB minimum. Thus, the design value of the voltage feedback amount β0=0.045 and the design value of the current feedback amount β1=1.40 satisfy the loop gain requirement.

The power amplifying apparatus 1 according to the first embodiment was tested under the conditions of the voltage feedback amount β0 design value=0.045, the current feedback amount β1 design value=1.40, and the maximum output power of the power amplifying apparatus 1 of 90 W/4Ω, to obtain the following test results.

Figure 9:
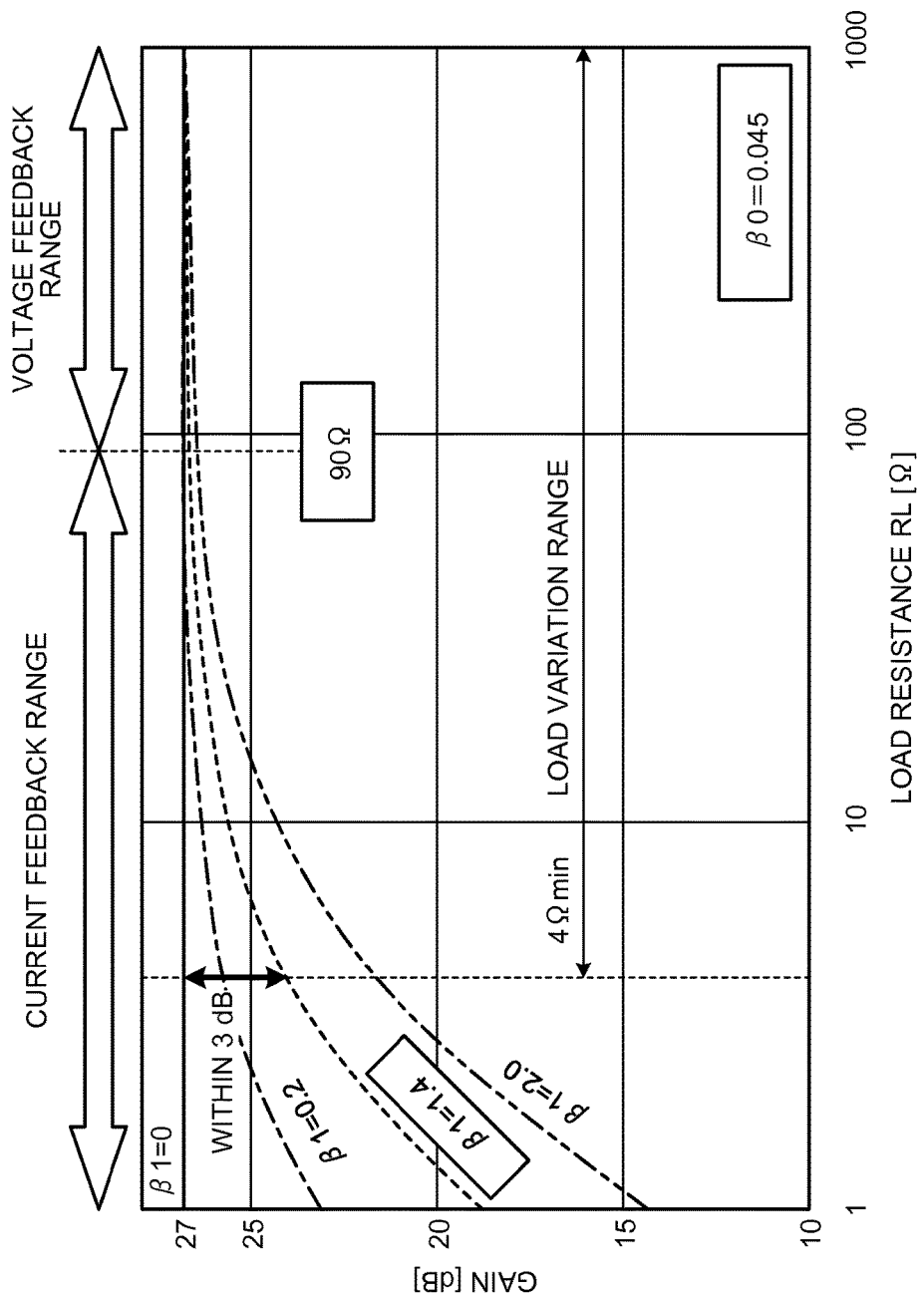
FIG. 9 is a graph illustrating dependency of gain on output load resistance in the power amplifying apparatuses connected in parallel with each other according to the first embodiment.
Figure 10:
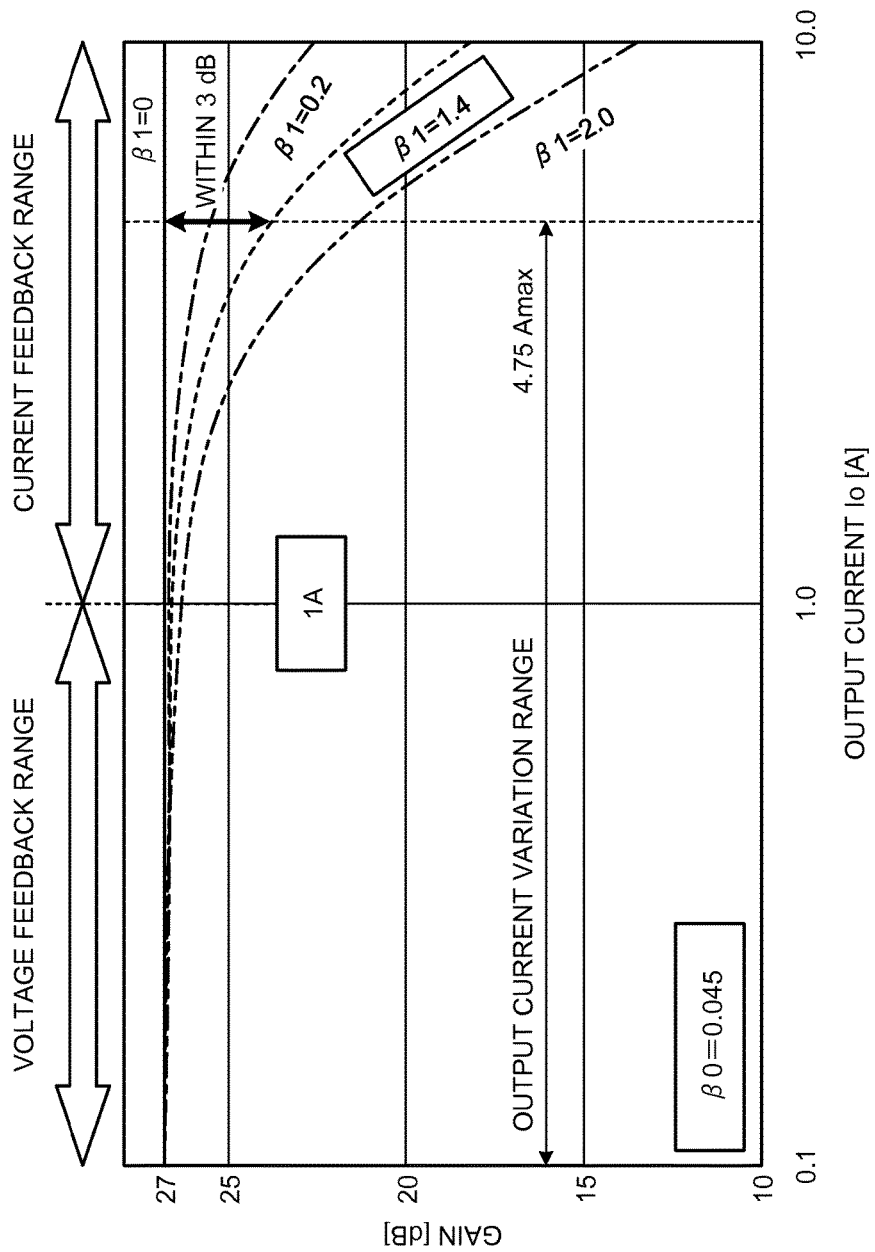
FIG. 10 is a graph illustrating dependency of gain on an output current in the power amplifying apparatuses connected in parallel with each other according to the first embodiment.

FIG. 9 is a graph illustrating a relation between the amplifier gain set as a requirement to 27 dB of the power amplifying apparatus 1 and the load resistance RL of the load 12 (dependency of the amplifier gain on the load resistance). FIG. 10 is a graph illustrating a relation between the amplifier gain set as a requirement to 27 dB of the power amplifying apparatus 1 and the output current Io supplied from the power amplifying apparatus 1 to the load 12 (dependency of the amplifier gain on the output current).

By optimizing the voltage feedback amount β0 set to 0.045 and the current feedback amount β1 set to 1.40 for the power amplifying apparatus 1, the voltage feedback and the current feedback vary automatically with 90Ω as a boundary of the load 12 as illustrated in FIG. 9. Similarly, the voltage feedback and the current feedback vary automatically with 1 A as a boundary of the output current as illustrated in FIG. 10.

Specifically, take a look at the characteristic curve of the current feedback amount β1=1.40 illustrated in FIG. 9. When the load resistance RL of the load 12 is 4Ω, it represents a minimum load resistance value that satisfies the required gain variation range (load dependency) of 3 dB maximum. Thereafter, the current feedback amount β1 gradually increases with a gradual increase in the load resistance RL and varies within a range of the amplifier gain of 27 dB of the power amplifying apparatus 1 to respond to the variations in the load resistance RL. Then, with the load resistance RL value at 90Ω as a boundary, the effect of the voltage feedback amount β0 is predominant. The current feedback range illustrated in FIG. 9 indicates that the effect of the current feedback amount β1 is predominant in the range of the load resistance RL between 4Ω and 90Ω. Alternatively, the voltage feedback range illustrated in FIG. 9 indicates that the effect of the voltage feedback amount β0 is predominant in the range of the load resistance RL exceeding 90Ω.

Now, take a look at the characteristic curve of the current feedback amount β1=1.40 illustrated in FIG. 10. When the value of the output current Io of the power amplifying apparatus 1 is 4.75 A, it represents a maximum current variation value that satisfies the required gain variation range (load dependency) of 3 dB maximum. Specifically, the gain variation range (load dependency) satisfies the required 3 dB maximum when the value of the output current Io of the power amplifying apparatus 1 falls within an output current variation range of 0.1 A to 4.75 A. In addition, the effect of the voltage feedback amount β0 is predominant when the value of the output current Io falls within an output current variation range of 0.1 A to 1 A. The voltage feedback range illustrated in FIG. 10 indicates a range over which the effect of the voltage feedback amount β0 is predominant. The effect of the current feedback amount β1 is predominant when the value of the output current Io falls within an output current variation range of 1 A to 4.75 A. The current feedback range illustrated in FIG. 10 indicates a range over which the effect of the current feedback amount β1 is predominant. When the value of the output current Io falls within the output current variation range of 1 A to 4.75 A, the effect of the current feedback amount is predominant and the amplifier gain of the power amplifying apparatus 1 is reduced to a predetermined value.

Thus, when a plurality of power amplifying apparatuses 1 are connected in parallel with each other and operated, and when a voltage difference occurs between each pair of the power amplifying apparatuses 1, the effect of the current feedback absorbs the voltage difference, thereby stabilizing the parallel operation of each of the power amplifying apparatuses 1. When the value of the output current Io is as low as below 1 A, the effect of the voltage feedback allows audio performance to be sufficiently derived. Preferably, the current feedback amount β1 with respect to the set voltage feedback amount β0 should be set to a greater value for better sound quality and to a smaller value for stability in the parallel operation of each of the power amplifying apparatuses 1.

As evident from the foregoing description, the power amplifying apparatus 1 in the first embodiment uses the current feedback circuit 9 to provide negative feedback of a predetermined amount of a current value of the sound signal demodulated by the LPF 6 and uses the voltage feedback circuit 8 to provide negative feedback of a predetermined amount of a voltage value of the sound signal demodulated by the LPF 6. The adder 10 then performs addition to the input sound signal. Because the current feedback amount β1 of the current value detected from the demodulated sound signal and the voltage feedback amount β0 can be freely set, variations in the output voltages among the power amplifying apparatuses 1 connected in parallel with each other can be absorbed with high accuracy.

Additionally, the ability of the power amplifying apparatus 1 in the first embodiment to absorb with high accuracy the variations in the output voltages among the power amplifying apparatuses 1 connected in parallel with each other eliminates the need to widely vary the power supply voltage in order for each of the power amplifying apparatuses 1 to perform a parallel operation. The power amplifying apparatus 1 in the first embodiment requires no high voltage-resistant elements, thus achieving low cost.

In addition, the power amplifying apparatus 1 in the first embodiment can automatically respond to load variations in the load 12 connected to each of the power amplifying apparatuses 1 performing parallel operations. This ability eliminates the need for advance measurement of the load and achieves a simple circuit configuration involving a small number of elements.

The power amplifying apparatus 1 has the output power and the load variation range that vary with, for example, the product category, use environment, and use site, so that the ratio of the current feedback amount β1 to the voltage feedback amount β0 needs to be optimized for each product. The power amplifying apparatus 1 in the first embodiment, however, enables free setting of the ratio of the current feedback amount β1 and the voltage feedback amount β0, so as to offer a high degree of freedom of adaptability to the power amplifying apparatus 1 having any types of specifications.

Woofers as a type of speaker units reproducing bass sounds are classified into a current feedback type and a voltage feedback type. Application of the above-described current feedback and voltage feedback, however, allows sound quality and large current drive to be optimized, facilitating adjustments of the sound quality (crisp feelings).

Additionally, the power amplifying apparatus 1 in the first embodiment is applicable to BTL connection in which two outputs of a stereo amplifier are bridge-connected for use as a monaural amplifier by inputting a sound signal to a first channel in normal phase and a sound signal to a second channel in inverted phase, and connecting outputs therefrom in positive polarity to a speaker unit. BTL is an abbreviation for "bridged transless".

Second Embodiment

Figure 11:
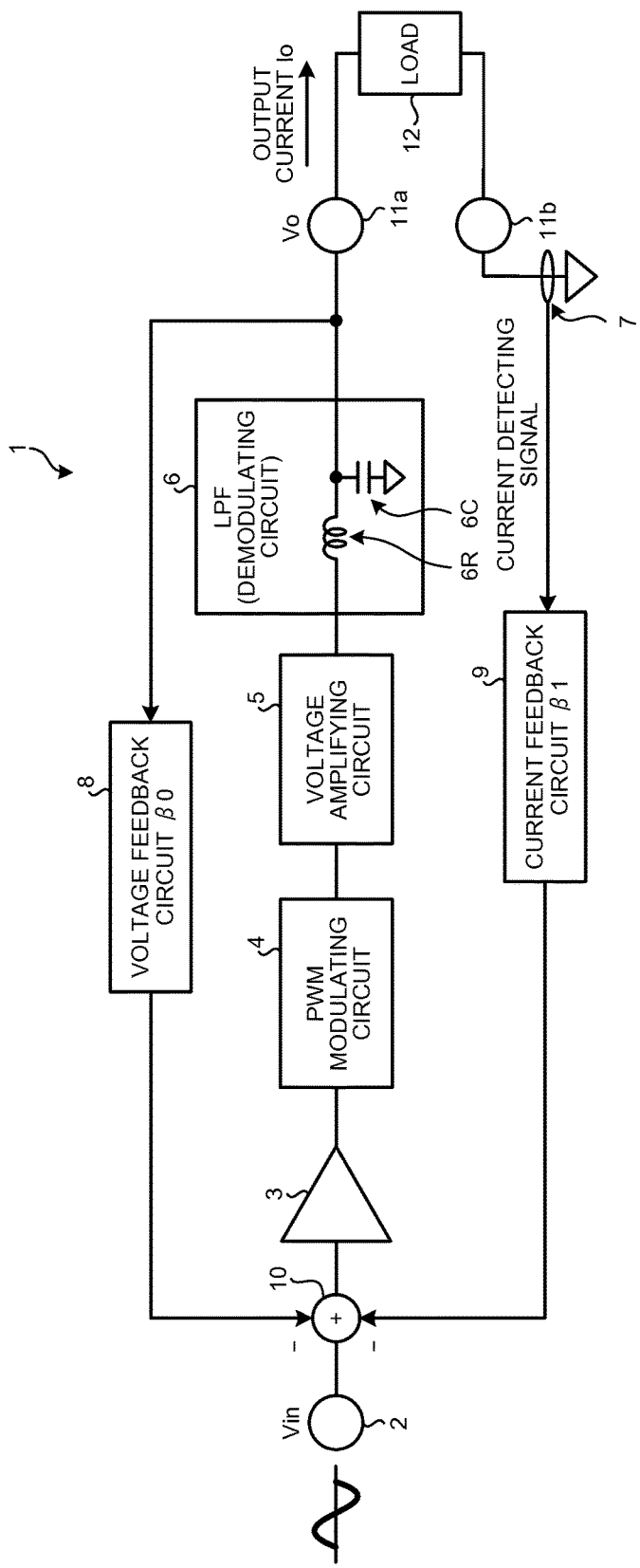
FIG. 11 is a block diagram illustrating a power amplifying apparatus according to a second embodiment to which the present invention is applied.

The following describes a power amplifying apparatus according to a second embodiment of the present invention. The power amplifying apparatus 1 in the first embodiment includes the current detecting circuit 7 at the output stage of the LPF 6. This power amplifying apparatus 1 according to the second embodiment includes a current detecting circuit 7 disposed between an output terminal 11b and ground as illustrated in FIG. 11. Only such a difference will hereinafter be described and duplicated description is omitted.

Figure 12:
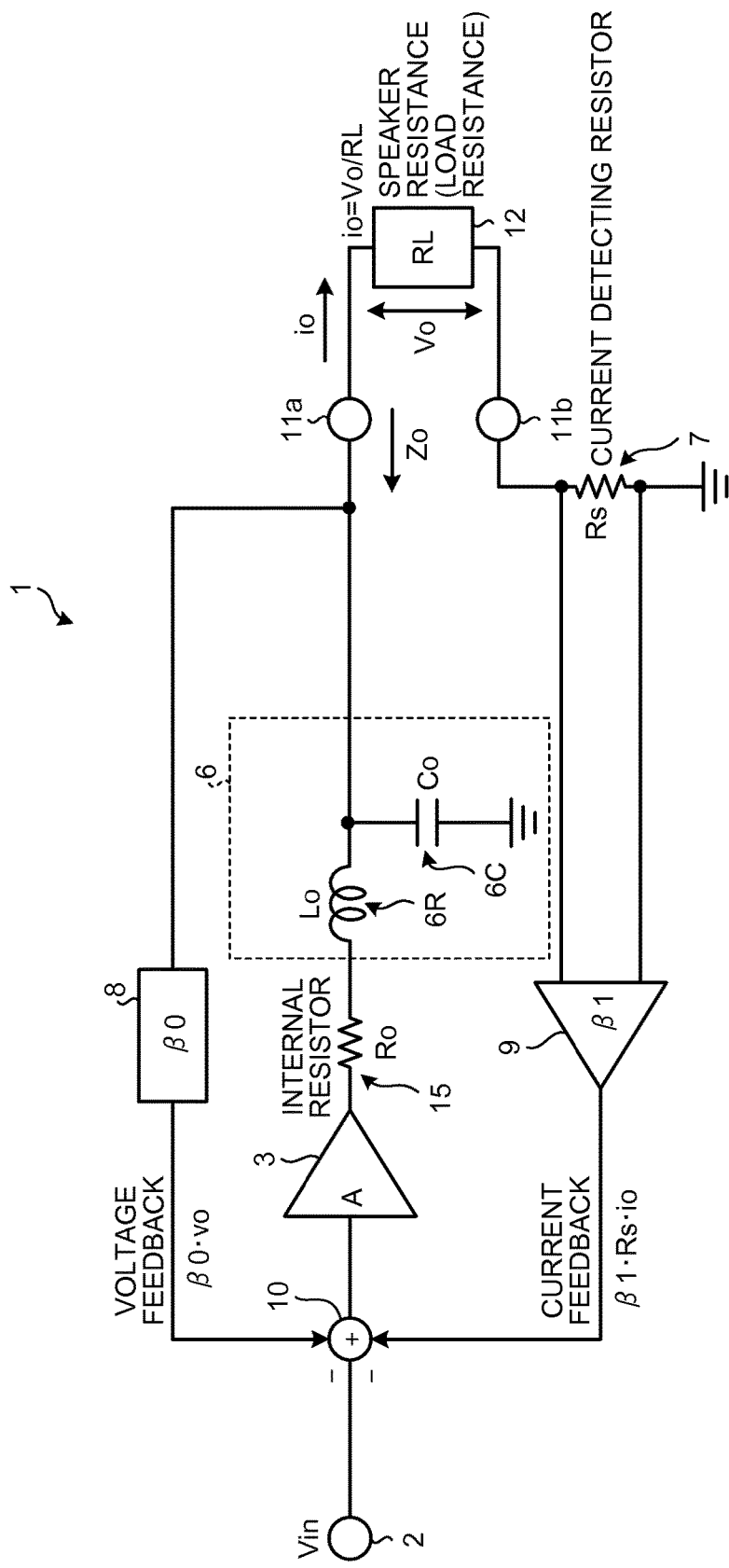
FIG. 12 is an equivalent circuit diagram of the power amplifying apparatus according to the second embodiment.

FIG. 12 illustrates an equivalent circuit diagram of the power amplifying apparatus 1 according to the second embodiment. In the power amplifying apparatus 1 in the second embodiment, a current detecting resistor Rs of the current detecting circuit 7 is inserted and connected between the output terminal 11b and the ground. A voltage across the current detecting resistor Rs is thereby detected as a present value of an output current Io and negative feedback is provided to an adder 10 via a current feedback circuit 9. The same effect achieved by the power amplifying apparatus 1 in the first embodiment can thereby be achieved.

Third Embodiment

The following describes a power amplifying apparatus according to a third embodiment of the present invention. This power amplifying apparatus 1 of the third embodiment includes a filter that removes switching noise unique to the digital amplifier from a current detecting output from a current detecting circuit 7. Only such a difference will hereinafter be described and duplicated description is omitted.

Figure 13:
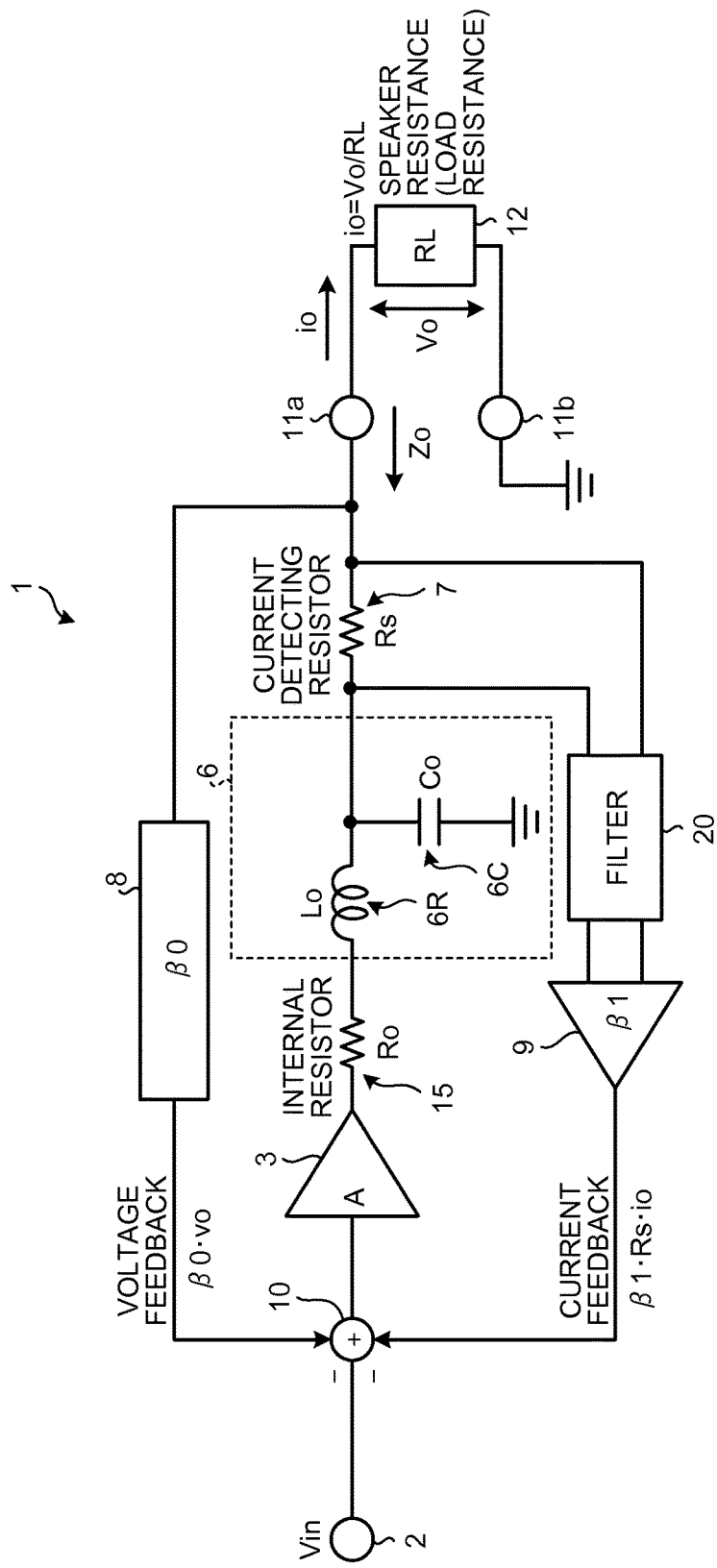
FIG. 13 is an equivalent circuit diagram of a power amplifying apparatus according to a third embodiment to which the present invention is applied.

FIG. 13 illustrates an equivalent circuit diagram of the power amplifying apparatus 1 according to the third embodiment. The power amplifying apparatus 1 in the third embodiment includes a filter 20 that removes switching noise unique to the digital amplifier from the current detecting output detected by a current detecting resistor Rs in the current detecting circuit 7 as illustrated in FIG. 13.

In the power amplifying apparatus 1, the voltage amplifying circuit 5 may, for example, incorporate, as described earlier, two output power MOSFETs to switch a relatively high voltage at a timing of a pulse width of the pulse width-modulated sound signal. As a result, spike noise-like switching noise is superimposed over the sound signal. The filter 20 removes the switching noise from the current detecting output detected by the current detecting resistor Rs and supplies a resultant signal to a current feedback circuit 9.

This arrangement successfully prevents the current feedback circuit 9 from operating erratically to enhance stability of an output current io. Additionally, similar effects as those achieved by each of the above-described embodiments can be achieved. It is noted that the filter 20 may be incorporated in the current feedback circuit 9.

Fourth Embodiment

The following describes a power amplifying apparatus according to a fourth embodiment of the present invention. This power amplifying apparatus 1 in the fourth embodiment includes a microprocessor that automatically controls determinations of the above-described voltage feedback amount β0 and current feedback amount β1. Only such a difference will hereinafter be described and duplicated description is omitted.

Figure 14:
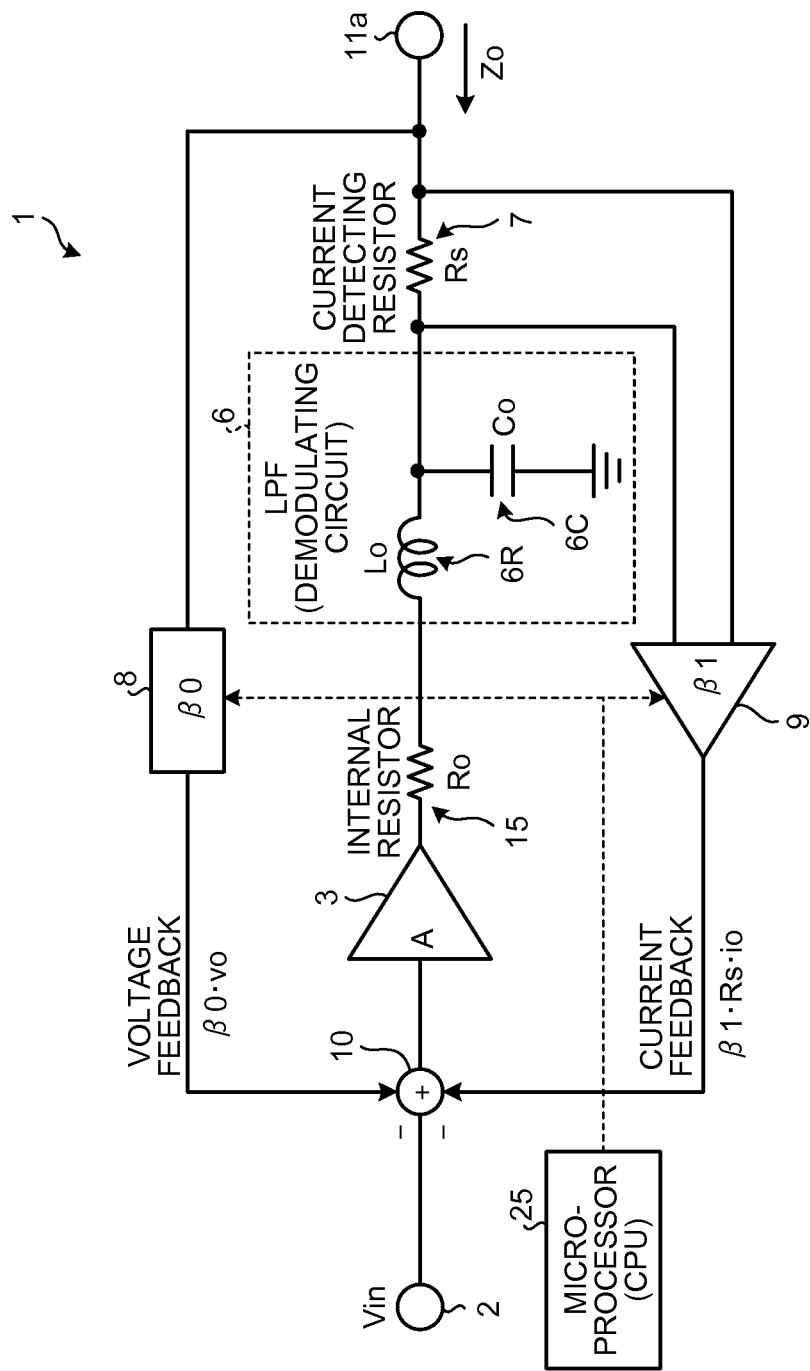
FIG. 14 is an equivalent circuit diagram of a power amplifying apparatus according to a fourth embodiment to which the present invention is applied.

FIG. 14 illustrates an equivalent circuit diagram of the power amplifying apparatus 1 according to the fourth embodiment. The power amplifying apparatus 1 in the fourth embodiment includes a microprocessor 25 as an exemplary controller that controls the voltage feedback amount β0 and the current feedback amount β1. Specifically, the microprocessor 25 sets for a voltage feedback circuit 8 the voltage feedback amount β0 that has been optimized as described above and corresponds to a desired amplifier gain input by the user. The microprocessor 25 next optimizes, from the optimized voltage feedback amount β0, the current feedback amount β1 with respect to previously set output resistance Zo of the power amplifying apparatus 1. It is noted that the microprocessor 25 may automatically optimize the current feedback amount β1 through a user's input of the desired output resistance Zo.

Exemplarily, the microprocessor 25 sets in the current feedback circuit 9 a large current feedback amount β1 value when sound quality is considered and a small current feedback amount β1 value when stability in the parallel operation of each of the power amplifying apparatuses 1 connected in parallel with each other is considered. If the power amplifying apparatuses 1 are not to be operated in parallel with each other, the microprocessor 25 may set a small or zero current feedback amount β1 value in the current feedback circuit 9.

Figure 15:
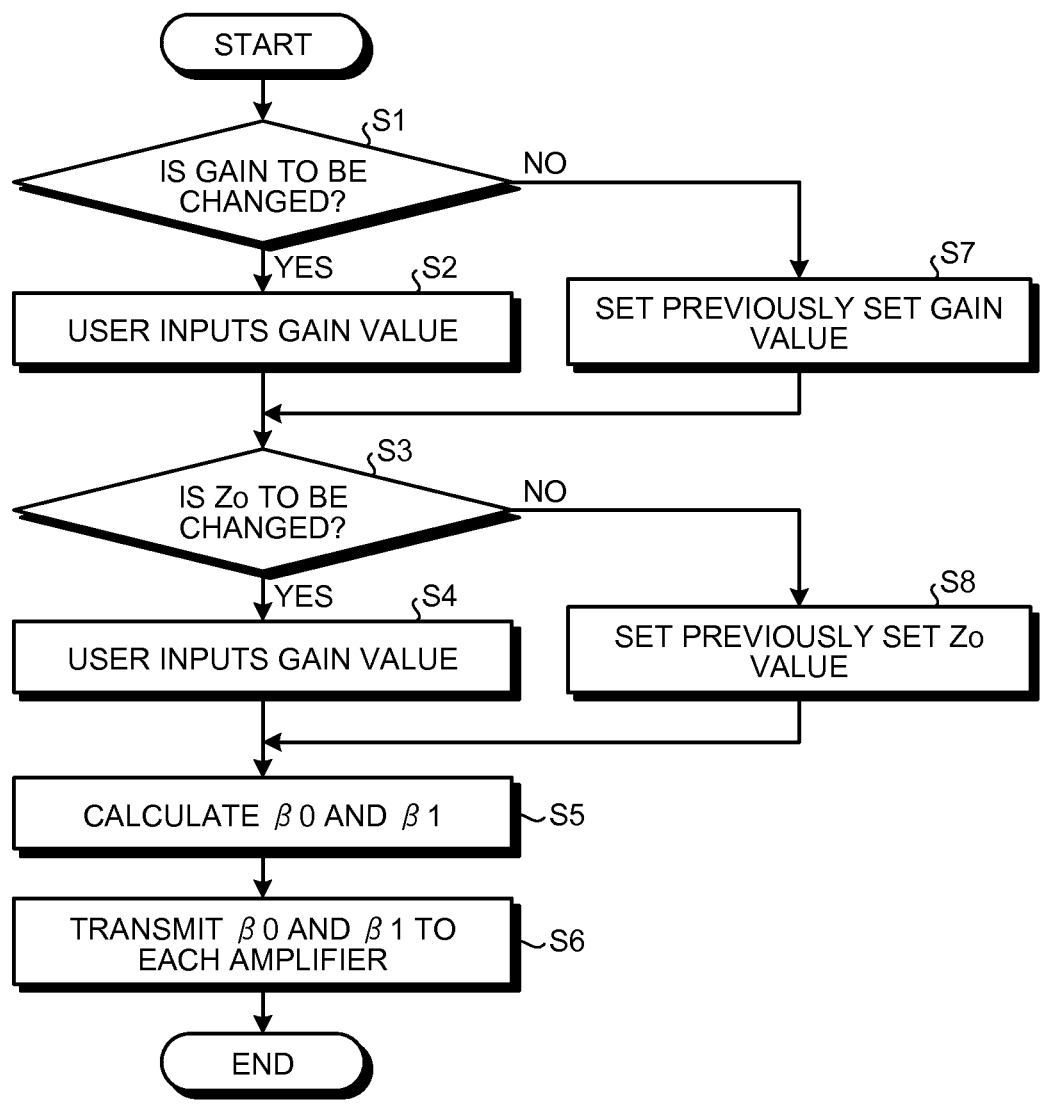
FIG. 15 is a flowchart for illustrating operations of the power amplifying apparatus according to the fourth embodiment to which the present invention is applied.

FIG. 15 is a flowchart illustrating operations performed by the microprocessor 25 in the power amplifying apparatus 1 according to the fourth embodiment. At step S1, the user inputs whether to change the amplifier gain. If the user performs an input operation indicating that the amplifier gain is not to be changed (No at step S1), the microprocessor 25 performs step S7, reads an amplifier gain value set in advance, and performs step S3.

If the user performs an input operation indicating that the amplifier gain is to be changed (Yes at step S1), the microprocessor 25 acquires the amplifier gain value input by the user at step S2 and performs step S3.

At step S3, the microprocessor 25 determines whether the user performs an input operation that directs a change in the output resistance Zo of the power amplifying apparatus 1. If the input operation that directs a change in the output resistance Zo of the power amplifying apparatus 1 is not detected (No at step S3), the microprocessor 25 reads a previously set output resistance Zo value at step S8 and performs step S5.

If the input operation that directs a change in the output resistance Zo of the power amplifying apparatus 1 is detected (Yes at step S3), the microprocessor 25 reads at step S4 an output resistance Zo value input by the user and performs step S5.

At step S5, the microprocessor 25 calculates the voltage feedback amount $\beta 0$ and the current feedback amount $\beta 1$ using the amplifier gain and the output resistance Zo. Then at step S6, the microprocessor 25 sets the calculated voltage feedback amount $\beta 0$ in the voltage feedback circuit 8 as illustrated in FIG. 14 and sets the calculated current feedback amount $\beta 1$ in the current feedback circuit 9.

These operations enable automatic setting of the voltage feedback amount $\beta 0$ in the voltage feedback circuit 8 and the current feedback amount $\beta 1$ in the current feedback circuit 9. Additionally, similar effects as those achieved by each of the above-described embodiments can be achieved.

Fifth Embodiment

The following describes a power amplifying apparatus according to a fifth embodiment of the present invention. In the power amplifying apparatus 1 according to the fourth embodiment described above, the microprocessor 25 automatically sets the voltage feedback amount $\beta 0$ and the current feedback amount $\beta 1$ for the power amplifying apparatus 1 that includes the microprocessor 25. In contrast, the power amplifying apparatuses 1 connected in parallel with each other according to the fifth embodiment each include a microprocessor that communicates with the other microprocessor. The power amplifying apparatuses 1 according to the fifth embodiment are configured such that each of the microprocessors automatically sets the voltage feedback amount $\beta 0$ and the current feedback amount $\beta 1$ that achieve favorable parallel operations and favorable audio performance for the corresponding power amplifying apparatus 1 in which the microprocessor is included. Only such a difference will hereinafter be described and duplicated description is omitted.

Figure 16:
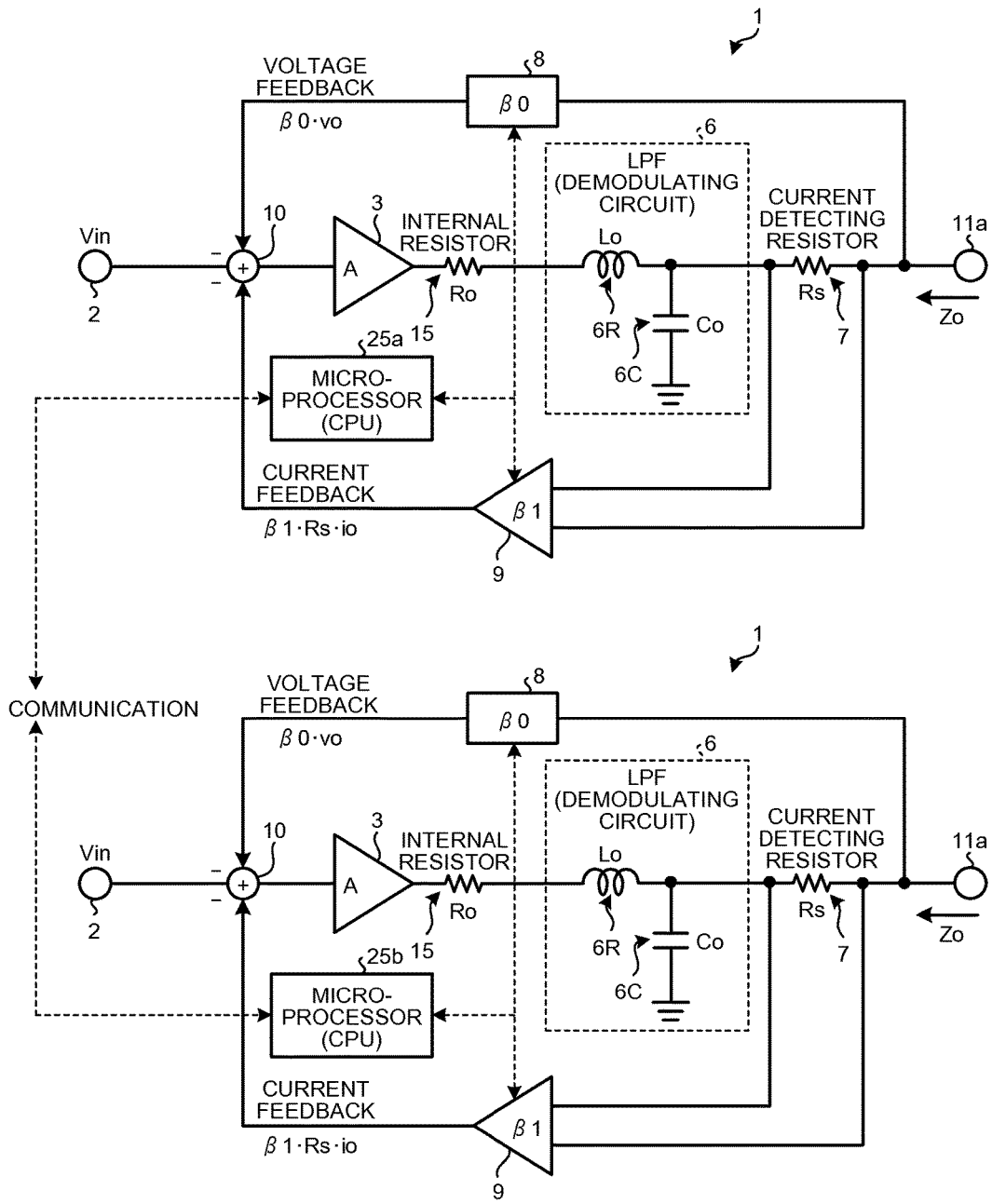
FIG. 16 is an equivalent circuit diagram of a power amplifying apparatus according to a fifth embodiment to which the present invention is applied.

FIG. 16 illustrates an equivalent circuit diagram of the power amplifying apparatuses 1 according to the fifth embodiment. As illustrated in FIG. 16, the power amplifying apparatuses 1 connected in parallel with each other according to the fifth embodiment each include a microprocessor 25a (or a microprocessor 25b). The microprocessor 25a (or the microprocessor 25b) detects the voltage feedback amount $\beta 0$ of a host power amplifying apparatus 1 and notifies the microprocessor 25b (or the microprocessor 25a) of the other power amplifying apparatus 1 connected in parallel with the host power amplifying apparatus 1 of the detected voltage feedback amount $\beta 0$. The microprocessor 25a or the microprocessor 25b compares the voltage feedback amount $\beta 0$ of the host power amplifying apparatus 1 with the voltage feedback amount $\beta 0$ notified by the other microprocessor. The microprocessor 25a or the microprocessor 25b transmits a result of the comparison to the other microprocessor and sets the voltage feedback amount $\beta 0$ to be used for calculations. The microprocessor 25a or the microprocessor 25b calculates the current feedback amount $\beta 1$ using the set voltage feedback amount $\beta 0$ and the output resistance Zo of the host power amplifying apparatus 1, thereby automatically setting the current feedback amount $\beta 1$ and the voltage feedback amount $\beta 0$.

Figure 17:
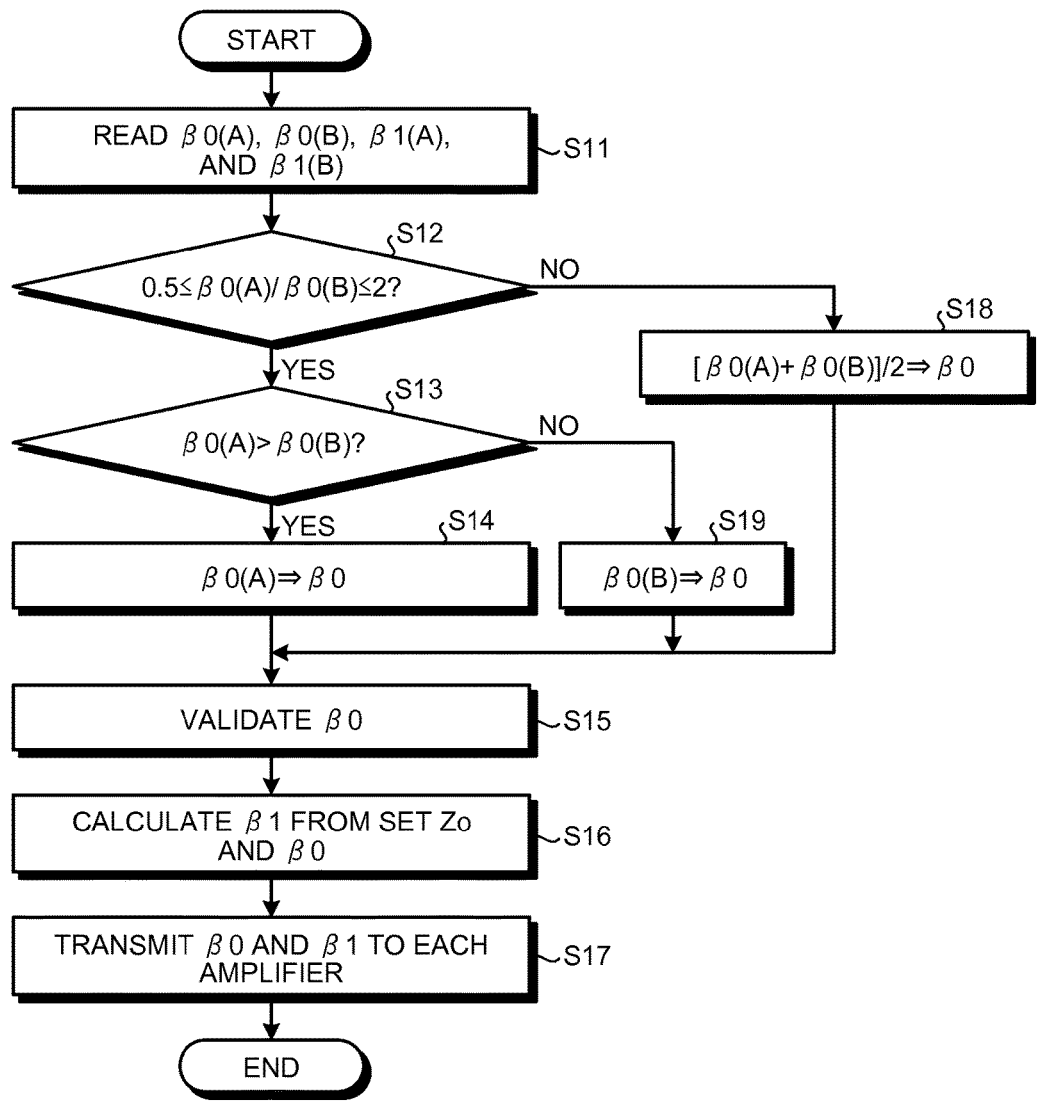
FIG. 17 is a flowchart for illustrating operations of the power amplifying apparatus according to the fifth embodiment to which the present invention is applied.

FIG. 17 is a flowchart illustrating operations for automatically setting the current feedback amount $\beta 1$ and the voltage feedback amount $\beta 0$ in the power amplifying apparatuses 1 according to the fifth embodiment. At step S11 of the flowchart illustrated in FIG. 17, the microprocessor 25a and the microprocessor 25b of the respective power amplifying apparatuses 1 each detect the present voltage feedback amount $\beta 0$ and current feedback amount $\beta 1$ of the host power amplifying apparatus 1. The microprocessor 25a transmits the voltage feedback amount $\beta 0$ of the host power amplifying apparatus 1 to the microprocessor 25b and the microprocessor 25b transmits the voltage feedback amount $\beta 0$ of the host power amplifying apparatus 1 to the microprocessor 25a. The operation then proceeds to step S12.

At step S12, the microprocessor 25a or the microprocessor 25b compares the voltage feedback amount $\beta 0$ of the host power amplifying apparatus 1 with the voltage feedback amount $\beta 0$ of the other power amplifying apparatus 1 obtained through the communication. It is then determined whether a result of the comparison is, for example, equal to or greater than 0.5 and equal to or less than 2 ($0.5 \leq \beta 0(A) \beta 0(B) \leq 2$). It is noted that $\beta 0$ (A) denotes the voltage feedback amount of the host power amplifying apparatus 1 and $\beta 0(B)$ denotes the voltage feedback amount of the other power amplifying apparatus 1 obtained through the communication.

A ratio of one voltage feedback amount $\beta 0$ to the other voltage feedback amount $\beta 0$ not falling within the range of being equal to or greater than 0.5 and equal to or less than 2, means that the ratio exceeds the predetermined range. In this case (No at step S12), the microprocessor 25a or the microprocessor 25b performs step S18 and determines a median value of the corresponding voltage feedback amount $\beta 0$ as the voltage feedback amount $\beta 0$ to be set for the host power amplifying apparatus 1 ($(\beta 0(A)+\beta 0(B))/2=\beta 0$ to be set).

In contrast, if the ratio of one voltage feedback amount $\beta 0$ to the other voltage feedback amount $\beta 0$ falls within the range of being equal to or greater than 0.5 and equal to or less than 2 (Yes at step S12), the microprocessor 25a or the microprocessor 25b performs step S13. At step S13, the microprocessor 25a or the microprocessor 25b determines whether the voltage feedback amount $\beta 0$ of the host power amplifying apparatus 1 is greater than the voltage feedback amount $\beta 0$ of the other power amplifying apparatus 1 ($\beta 0(A)>\beta 0(B)$).

If it is determined that the voltage feedback amount $\beta 0$ of the host power amplifying apparatus 1 is greater than the voltage feedback amount $\beta 0$ of the other power amplifying apparatus 1 (Yes at step S13), the microprocessor 25a or the microprocessor 25b determines at steps S14 and S15 the voltage feedback amount $\beta 0$ of the host power amplifying apparatus 1 as the voltage feedback amount $\beta 0$ to be set for the host power amplifying apparatus 1. In contrast, if it is determined that the voltage feedback amount $\beta 0$ of the host power amplifying apparatus 1 is smaller than the voltage feedback amount $\beta 0$ of the other power amplifying apparatus 1 (No at step S13), the microprocessor 25a or the microprocessor 25b determines at steps S19 and S15 the voltage feedback amount $\beta 0$ of the other power amplifying apparatus 1 obtained through the communication as the voltage feedback amount β0 to be set for the host power amplifying apparatus 1. Specifically, the microprocessor 25a or the microprocessor 25b adopts the greater voltage feedback amount β0. This is because the greater voltage feedback amount β0 improves sound quality.

The microprocessor 25a or the microprocessor 25b then, at step S16, calculates the current feedback amount β1 as described above using the output resistance Zo set for the host power amplifying apparatus 1 and the determined voltage feedback amount β0. At step S17, the microprocessor 25a or the microprocessor 25b, while setting the determined voltage feedback amount β0 in a voltage feedback circuit 8 of the host power amplifying apparatus 1, sets the calculated current feedback amount β1 in a current feedback circuit 9 of the host power amplifying apparatus 1. The microprocessor 25a or the microprocessor 25b thereby terminates the operations of the flowchart illustrated in FIG. 17. The foregoing operations enable the current feedback amount β1 and the voltage feedback amount β0 to be automatically determined and set for the host power amplifying apparatus 1 through the communication conducted between the power amplifying apparatuses 1 connected in parallel with each other, in addition to achieving similar effects as those achieved by each of the above-described embodiments.

Sixth Embodiment

The following describes a power amplifying apparatus according to a sixth embodiment of the present invention. In the power amplifying apparatus 1 according to each of the first to fifth embodiments described above, when the load 12 varies to reduce the load resistance, the amount of current flowing from the power amplifying apparatus to the load 12 varies. This can impair favorable parallel operations and audio characteristics. The power amplifying apparatus 1 according to the sixth embodiment controls the current feedback circuit so as to increase the current feedback amount when the load resistance is reduced and the output current is equal to or greater than a threshold value, thereby reducing the amount of current flowing through the load 12. Only such a difference will hereinafter be described and duplicated description is omitted.

Figure 18:
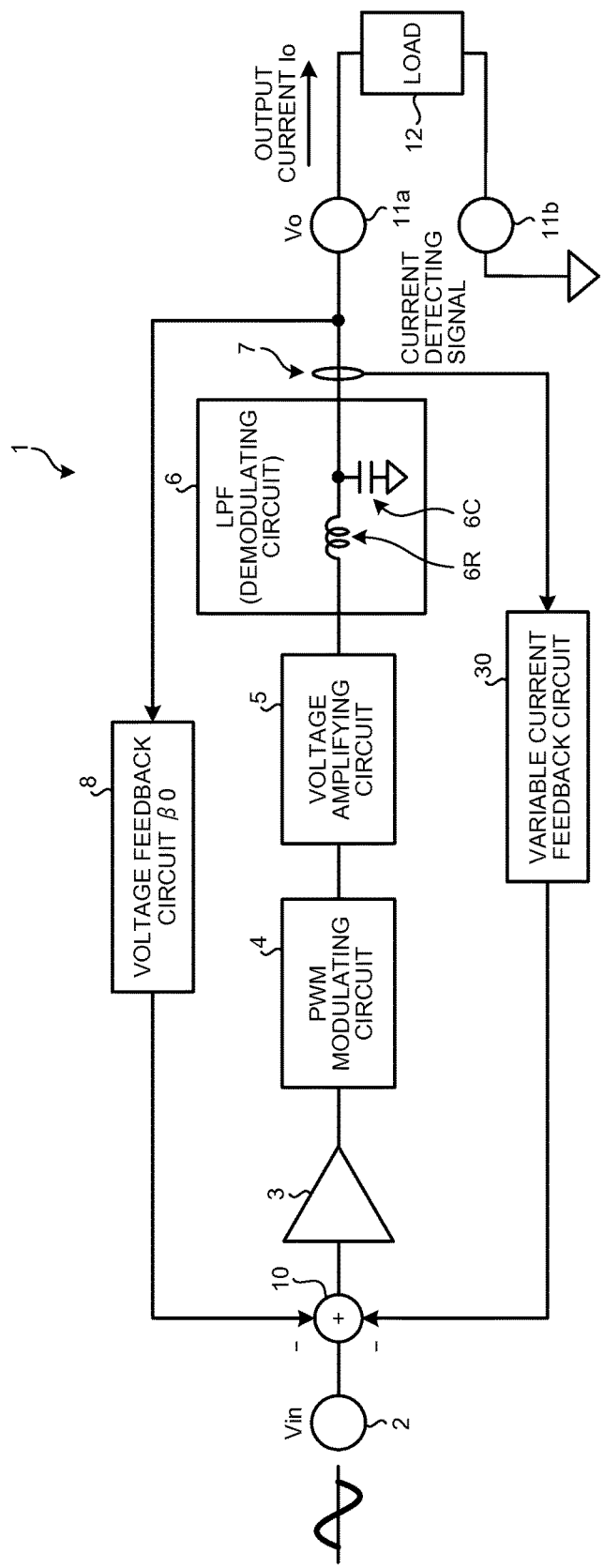
FIG. 18 is a block diagram illustrating a power amplifying apparatus according to a sixth embodiment to which the present invention is applied.

FIG. 18 is a block diagram illustrating the power amplifying apparatus according to the sixth embodiment. As illustrated in FIG. 18, the power amplifying apparatus according to the sixth embodiment includes a variable current feedback circuit 30 having a function of changing over the current feedback amount β1. At a stage in rear of an LPF 6, the variable current feedback circuit 30 changes over the current feedback amount from a current feedback amount β1 (small current feedback amount) to a current feedback amount β2 (large current feedback amount), or vice versa, according to a present amount of current of a sound signal detected by a current detecting circuit 7.

Figure 19:
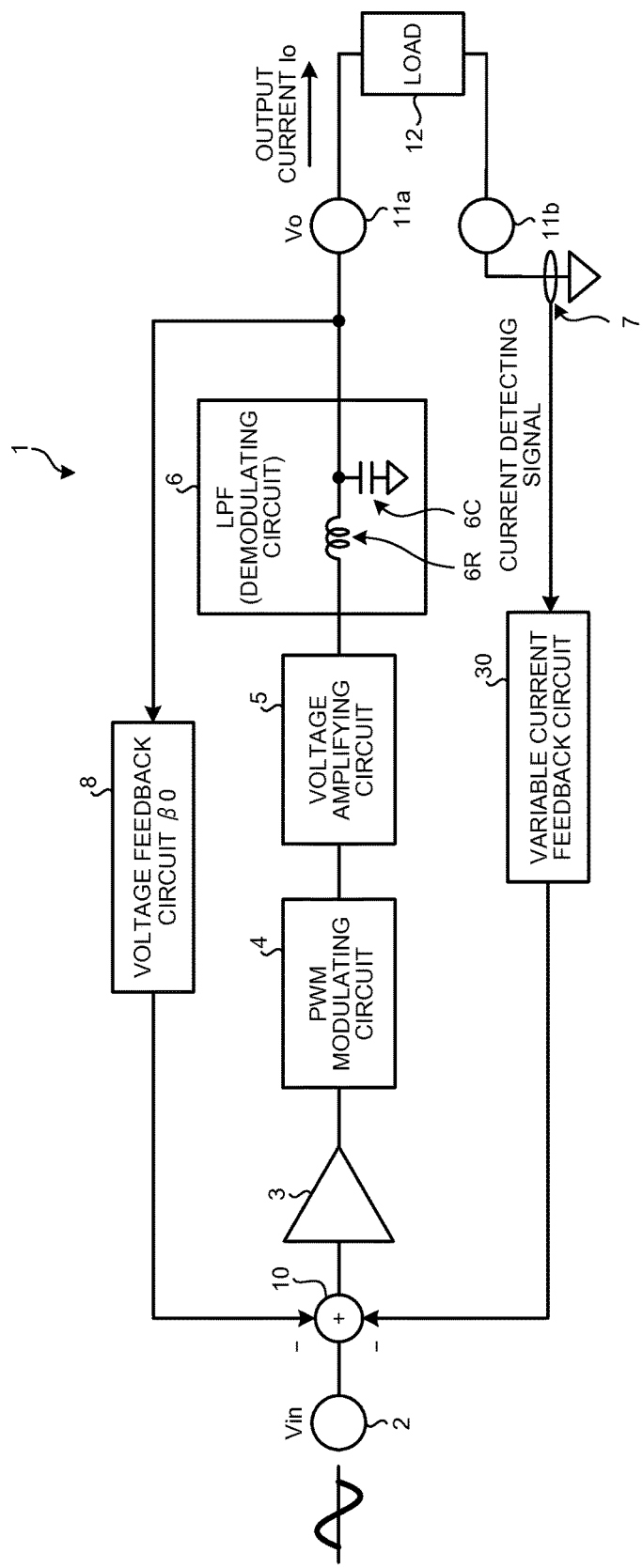
FIG. 19 is a block diagram illustrating a power amplifying apparatus according to a modification of the sixth embodiment to which the present invention is applied.

The following description assumes that the current feedback amount is changed over in two steps between the current feedback amount β1 and the current feedback amount β2. The current feedback amount may, nonetheless, be changed over among three steps or more, or in an analog stepless manner. Additionally, the current detecting circuit 7, though it is disposed at the rear stage of the LPF 6 in the sixth embodiment, may be disposed between an output terminal 11b and ground as illustrated in FIG. 19. In either case, effects similar to those to be later described can be achieved.

Figure 20:
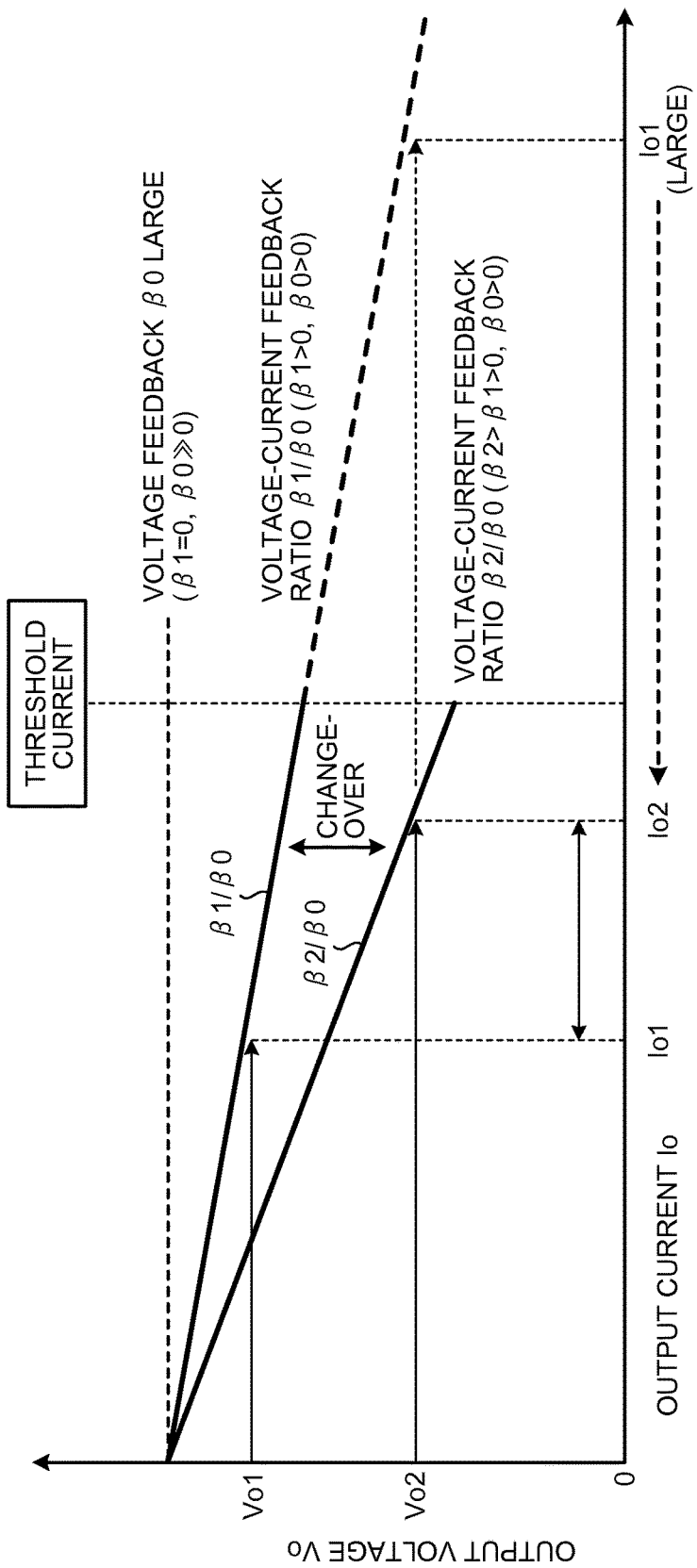
FIG. 20 is a graph for illustrating theory of operation of the power amplifying apparatus according to the sixth embodiment to which the present invention is applied.

The following describes a principle of the power amplifying apparatus in the sixth embodiment. FIG. 20 illustrates a relation between an output current Io and an output voltage Vo of the power amplifying apparatus 1. When load resistance of a load 12 connected to the power amplifying apparatus varies to be reduced, an output current Io1 increases (Io1→Io1(large)) at a gradient of current feedback amount β1/voltage feedback amount β0 as illustrated in FIG. 20. This situation is likely to impair favorable parallel operations and audio characteristics.

To prevent the above situation from developing, the variable current feedback circuit 30 compares a present output current value detected by the current detecting circuit 7 with a predetermined threshold value (a threshold current) while current feedback control is being performed. As the load resistance is reduced to increase the output current Io and when the current amount of the output current Io is equal to or more the threshold value (the threshold current), the current feedback amount is changed over from the current feedback amount β1 (small current feedback amount) to the current feedback amount β2 (large current feedback amount). This changeover allows the output current Io (large) having a large amount of current flowing to the load 12 side to be reduced to the current amount of an output current Io2. Thus, when the load resistance changes and reduces, an inconvenience can be prevented of favorable parallel operations and audio characteristics being impaired due to the resultant large output current Io1. Additionally, similar effects as those achieved by each of the above-described embodiments can be achieved.

Should the current amount of the output current Io be less than the threshold value (the threshold current) as a result of performance of such current reduction control, then the variable current feedback circuit 30 returns the current feedback amount from the current feedback amount β2 (large current feedback amount) to the current feedback amount β1 (small current feedback amount).

The current feedback amount β1 (small current feedback amount) and the current feedback amount β2 (large current feedback amount) of the variable current feedback circuit 30 are derived as described below. Specifically, the voltage feedback amount β0 is calculated from the amplifier gain specifications (27 dB: see FIG. 6) of the power amplifying apparatus and loop gain (sound quality improvement). In this example, the voltage feedback amount β0=0.045 as described earlier with reference to FIG. 7.

A limited range of the current feedback amount β1 (small current feedback amount) is next detected from the calculated voltage feedback amount β0, a circulating current that flows in each of the power amplifying apparatuses performing parallel operations due to variations in the output voltages of the power amplifying apparatuses, and a gain variation range. The current feedback amount β2 (large current feedback amount) is then derived from the calculated voltage feedback amount β0 and a required reduction in the amplifier gain.

Figure 21:
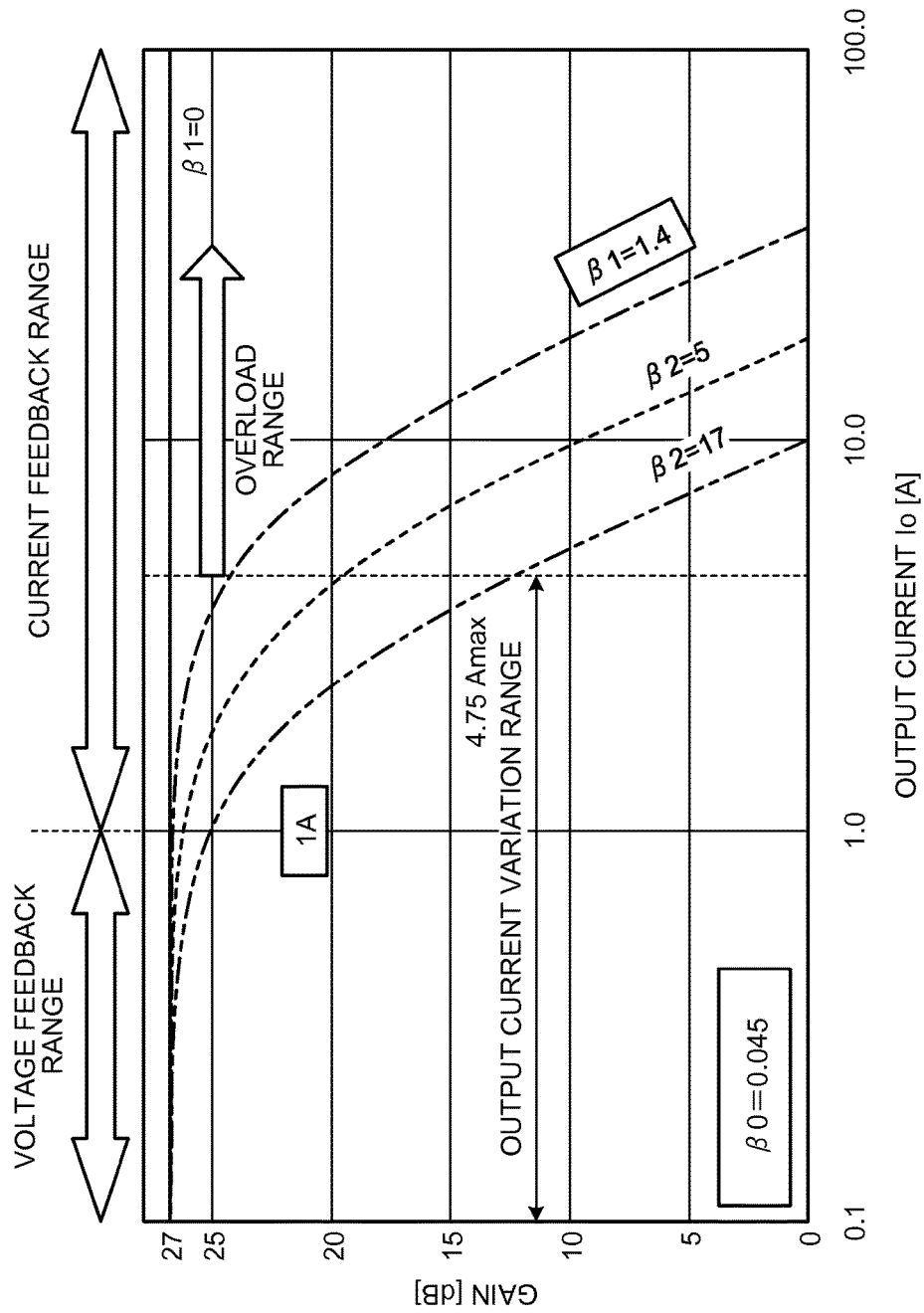
FIG. 21 is a graph for illustrating dependency of gain on an output current at a timing before a changeover of a current feedback amount in the power amplifying apparatus according to the sixth embodiment to which the present invention is applied.

FIG. 21 illustrates examples of the current feedback amount β1 and the current feedback amount β2 derived as described above. FIG. 21 is a graph illustrating a relation between the amplifier gain and the output current of the power amplifying apparatus 1 (dependency of the amplifier gain on the output current). In this example, the maximum output power is 90 W/4Ω as described with reference to FIG. 6, the voltage feedback amount β0=0.045, the current feedback amount β1 (small current feedback amount)=1.4, and the current feedback amount β2 (large current feedback amount)=17.

In this example, as illustrated in FIG. 21, the maximum current amount of the output current is 4.75 A and a permissible variable range of the output current (output current variable range) is between 0 A and 4.75 A. The above-described threshold current of the variable current feedback circuit 30 is set to 4.75 A.

It is noted that FIG. 21 indicates that the range of the output current between 0 A and 1.0 A is the voltage feedback range in which the effect of the voltage feedback amount β0 is predominant. FIG. 21 further indicates that the range of the output current of 1.0 A or more is the current feedback range in which the effect of the current feedback amount β1 (and the current feedback amount β2) is predominant. FIG. 21 further indicates that, of the current feedback range, an overload range is the range of the output current of 1.0 A or more.

Consider a case in which the current feedback amount β1 (small current feedback amount) of the variable current feedback circuit 30 is set to 1.4 and the current feedback amount β2 (large current feedback amount) of the variable current feedback circuit 30 is set to 17. When the output current Io is, for example, 6 A (the current threshold of 4.75 A or more), the variable current feedback circuit 30 changes over the current feedback amount from the current feedback amount β1 to the current feedback amount β2. This changeover reduces the amplifier gain of the power amplifying apparatus by 10 dB as illustrated in FIG. 22, thereby limiting the output current amount. Thus, the power amplifying apparatus 1 in the sixth embodiment can automatically limit the amount of current flowing to the load even when the load resistance is reduced due to, for example, a short circuit in the speaker unit or the line. The inconvenience of favorable parallel operations and audio characteristics being impaired can be prevented and similar effects as those achieved by each of the above-described embodiments can be achieved.

In the power amplifying apparatus in the sixth embodiment, when a current equal to or more than the threshold current flows to the load, the variable current feedback circuit 30 automatically reduces the current amount, so that an inconvenience of occurrence of, for example, sound distortion can be prevented. In addition, the power amplifying apparatus in the sixth embodiment eliminates the need for a power FET inserted in series with the output of the power amplifying apparatus, thus preventing any useless heat generation.

The power amplifying apparatus in the sixth embodiment can respond, in a high impedance line, to both load of a line short circuit (e.g., 2Ω to 6Ω) and an incomplete load short circuit (e.g., 6Ω or more). In a low impedance line, the power amplifying apparatus in the sixth embodiment can respond to both load of a line short circuit (e.g., 1Ω to 3Ω) and an incomplete load short circuit (e.g., 12Ω or more). Either case can be achieved by varying the current feedback amount (β1→β2), as calculated from a short-circuit current.

Specifically, the power amplifying apparatus in the sixth embodiment can respond to various types of load short circuits with a simple circuit without generating any useless heat. Even during control of the output current, the power amplifying apparatus can reduce distortion in the sound signal and transmit the sound clearly to the speaker unit. Additionally, the power amplifying apparatus allows the current feedback amount to be set freely so as to be optimized regardless of its product category, use environment, and use site The power amplifying apparatus in the sixth embodiment is also applicable to the BTL connection in which two outputs of a stereo amplifier are bridge-connected for use as a monaural amplifier by inputting a sound signal to a first channel in normal phase and a sound signal to a second channel in inverted phase, and connecting outputs therefrom in positive polarity to a speaker unit.

It is noted that the power amplifying apparatus in the sixth embodiment has been described for a case in which the current feedback amount β1 is switched to the current feedback amount β2, or vice versa. The power amplifying apparatus may nonetheless have separate current feedback loops of the current feedback amount β1 and the current feedback amount β2. In this case, the operating sequence is the current feedback amount β1→superimposition operation of the current feedback amount β1 and the current feedback amount β2 (superimposition operation: β1+β2).

While certain embodiments have been described, the embodiments have been presented by way of example only and are not intended to limit the scope of the invention. Indeed, the novel embodiments described herein may be embodied in a variety of other forms; furthermore, various omissions, substitutions, and changes in the form of the embodiment described herein may be made without departing from the spirit of the invention. For example, the power amplifying apparatus 1 according to each of the foregoing embodiments represents, what is called, a digital amplifier to which the present invention is applied. The present invention may nonetheless be applied to an analog amplifier, in which case, too, the same effects as those described above can be achieved. The present invention may still be applied to either a high impedance output amplifier or a low impedance output amplifier. The present invention may even be applied to parallel operations of motor drive control amplifiers. The accompanying claims and their equivalents are intended to cover such forms or modifications as would fall within the scope and spirit of the invention.

The present invention can make a plurality of power amplifying apparatuses connected in parallel with each other operate favorably.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. A power amplifying apparatus comprising:
an amplifier configured to amplify an input signal and supply a load with the amplified input signal;
a demodulating circuit including a coil connected in series with an output stage of the amplifier and a capacitor connected in parallel between an output side of the coil and ground, and configured to demodulate the input signal from the amplifier and output the demodulated signal as an output signal;
a current detecting circuit, disposed at an output stage of the demodulating circuit, configured to detect a current of the output signal from the demodulating circuit;
a current feedback circuit configured to provide feedback of the detected current of a certain feedback amount;
a voltage feedback circuit configured to provide feedback of a voltage of the output signal of a certain feedback amount;
an adjuster configured to adjust the input signal using the feedback current and the feedback voltage; and
a modulating circuit configured to digitally modulate the input signal and supply the amplifier with the digitally modulated signal.

2. The power amplifying apparatus according to claim 1, wherein the current detecting circuit is disposed in a line between an output terminal of the output signal and ground.

3. The power amplifying apparatus according to claim 1, wherein, when the power amplifying apparatus is connected in parallel with another power amplifying apparatus, the feedback amount of the current feedback circuit and the feedback amount of the voltage feedback circuit are each adjusted to a feedback amount that absorbs variations in output voltages of the power amplifying apparatuses.

4. The power amplifying apparatus according to claim 1, further comprising:
a filter configured to remove noise superimposed on a current detecting output detected by the current detecting circuit.

5. The power amplifying apparatus according to claim 1, further comprising:
a controller configured to optimize a feedback amount of the voltage using input amplifier gain of the power amplifying apparatus and set the optimized voltage feedback amount in the voltage feedback circuit, and configured to optimize, using the optimized voltage feedback amount, a feedback amount of the current corresponding to output resistance of the power amplifying apparatus and set the optimized current feedback amount in the current feedback circuit.

6. The power amplifying apparatus according to claim 1, further comprising:
a controller configured to optimize a feedback amount of the voltage using input amplifier gain of the power amplifying apparatus and set the optimized voltage feedback amount in the voltage feedback circuit, and configured to optimize, using the optimized voltage feedback amount, a feedback amount of the current corresponding to output resistance of the power amplifying apparatus and set the optimized current feedback amount in the current feedback circuit, wherein
the controller communicates with a controller provided in another power amplifying apparatus connected in parallel with the power amplifying apparatus to determine and set the optimized voltage feedback amount in the voltage feedback circuit and to determine and set the optimized current feedback amount in the current feedback circuit.

7. A power amplifying method comprising:
amplifying an input signal and supplying a load with the amplified input signal by an amplifier;
demodulating the input signal from the amplifier and outputting the demodulated signal as an output signal, by a demodulating circuit including a coil connected in series with an output stage of the amplifier and a capacitor connected in parallel between an output side of the coil and ground;
detecting a current of the output signal from the demodulating circuit by a current detecting circuit disposed at an output stage of the demodulating circuit;
providing feedback of the detected current of a certain feedback amount by a current detecting circuit;
providing feedback of a voltage of the output signal of a certain feedback amount by a voltage feedback circuit;
adjusting the input signal using the feedback current and the feedback voltage by an adjuster; and
digitally modulating the input signal and supplying the amplifier with the digitally modulated signal by a modulating circuit.

8. A power amplifying apparatus comprising:
an amplifier configured to amplify an input signal and supply a load with the amplified input signal;
a current detecting circuit, disposed at an output stage of the amplifier, configured to detect a current of an output signal from the amplifier;
a variable current feedback circuit configured to provide feedback of the current of a feedback amount changed over through a selection made from among a plurality of feedback amounts according to the detected current;
a voltage feedback circuit configured to provide feedback of a voltage of the output signal of a certain feedback amount; and
an adjuster configured to adjust the input signal using the feedback current and the feedback voltage.

9. The power amplifying apparatus according to claim 8, further comprising:
a modulating circuit configured to digitally modulate the input signal and supply the amplifier with the digitally modulated signal; and
a demodulating circuit configured to demodulate the input signal from the amplifier and output the demodulated signal.

10. The power amplifying apparatus according to claim 9, wherein the current detecting circuit is disposed in a line between an output terminal of the output signal and ground.

11. The power amplifying apparatus according to claim 9, wherein, when the power amplifying apparatus is connected in parallel with another power amplifying apparatus, the feedback amount of the variable current feedback circuit and the feedback amount of the voltage feedback circuit are each adjusted to a feedback amount that absorbs variations in output voltages of the power amplifying apparatuses.

12. The power amplifying apparatus according to claim 9, further comprising:
a filter configured to remove noise superimposed on a current detecting output detected by the current detecting circuit.

13. The power amplifying apparatus according to claim 9, further comprising:
a controller configured to optimize a feedback amount of the voltage using input amplifier gain of the power amplifying apparatus and set the optimized voltage feedback amount in the voltage feedback circuit, and configured to optimize, using the optimized voltage feedback amount, a feedback amount of the current corresponding to output resistance of the power amplifying apparatus and set the optimized current feedback amount in the variable current feedback circuit.

14. The power amplifying apparatus according to claim 9, further comprising:
a controller configured to optimize a feedback amount of the voltage using input amplifier gain of the power amplifying apparatus and set the optimized voltage feedback amount in the voltage feedback circuit, and configured to optimize, using the optimized voltage feedback amount, a feedback amount of the current corresponding to output resistance of the power amplifying apparatus and set the optimized current feedback amount in the variable current feedback circuit, wherein
the controller communicates with a controller provided in the other power amplifying apparatus connected in parallel with the power amplifying apparatus to determine and set the optimized voltage feedback amount in the voltage feedback circuit and to determine and set the optimized current feedback amount in the variable current feedback circuit.

15. A power amplifying method comprising:

amplifying an input signal and supplying a load with the amplified input signal by an amplifier;

detecting a current of an output signal from the amplifier by a current detecting circuit disposed at an output stage of the amplifier;

providing feedback of the current of a feedback amount changed over through a selection made from among a plurality of feedback amounts according to the detected current by a variable current feedback circuit;

providing feedback of a voltage of the output signal of a certain feedback amount by a voltage feedback circuit; and adjusting the input signal using the feedback current and the feedback voltage by an adjuster.

* * * * *